(12) United States Patent
Suzuhara

(10) Patent No.: US 11,322,431 B2
(45) Date of Patent: *May 3, 2022

(54) SEMICONDUCTOR DEVICE HAVING OUTER TERMINAL PORTIONS WITH CONDUCTIVE LAYER ON OUTER END SURFACES AND METHOD OF MANUFACTURING A SEMICONDUCTOR DEVICE

(71) Applicant: J-Devices Corporation, Usuki (JP)

(72) Inventor: Masafumi Suzuhara, Yokohama (JP)

(73) Assignee: Amkor Technology Singapore Holding Pte. Ltd., Singapore (SG)

(*) Notice: Subject to any disclaimer, the term of this patent is extended or adjusted under 35 U.S.C. 154(b) by 2 days.

This patent is subject to a terminal disclaimer.

(21) Appl. No.: 16/745,920

(22) Filed: Jan. 17, 2020

(65) Prior Publication Data

US 2020/0152555 A1    May 14, 2020

Related U.S. Application Data

(63) Continuation of application No. 16/053,965, filed on Aug. 3, 2018, now Pat. No. 10,559,523, which is a
(Continued)

(30) Foreign Application Priority Data

Mar. 8, 2016 (JP) .................................. 2016-44341

(51) Int. Cl.
*H01L 23/495* (2006.01)
*H01L 21/48* (2006.01)
(Continued)

(52) U.S. Cl.
CPC .... *H01L 23/49524* (2013.01); *H01L 21/4825* (2013.01); *H01L 21/4842* (2013.01);
(Continued)

(58) Field of Classification Search
CPC ......... H01L 23/49524; H01L 23/49541; H01L 23/49582; H01L 23/49579; H01L 21/56;
(Continued)

(56) References Cited

U.S. PATENT DOCUMENTS

| 5,656,550 A | 8/1997 | Tsuji et al. |
|---|---|---|
| 7,160,759 B2 | 1/2007 | Ito et al. |
| 9,741,641 B2 | 8/2017 | Shimizu et al. |
| 9,773,722 B1* | 9/2017 | Nondhasitthichai ........................ H01L 23/49582 |

(Continued)

FOREIGN PATENT DOCUMENTS

| JP | 2001-189410 A | 7/2001 |
|---|---|---|
| JP | 2002289756 A | 10/2002 |

(Continued)

OTHER PUBLICATIONS

Taiwan Search Report received Sep. 25, 2020.
Taiwan Search Report received Jun. 11, 2020.

*Primary Examiner* — Sonya McCall-Shepard
(74) *Attorney, Agent, or Firm* — Kevin B. Jackson

(57) ABSTRACT

A semiconductor package includes a die pad; a plurality of external connection terminals located around the die pad; a semiconductor chip located on a top surface of the die pad and electrically connected with the plurality of external connection terminals; and a sealing member covering the die pad, the plurality of external connection terminals and the semiconductor chip and exposing an outer terminal of each of the plurality of external connection terminals. A side surface of the outer terminal of each of the plurality of external connection terminals includes a first area, and the first area is plated.

16 Claims, 31 Drawing Sheets

Related U.S. Application Data continuation of application No. 15/446,426, filed on Mar. 1, 2017, now Pat. No. 10,062,638.

(51) Int. Cl.
 *H01L 21/56* (2006.01)
 *H01L 23/31* (2006.01)

(52) U.S. Cl.
 CPC .......... *H01L 21/56* (2013.01); *H01L 23/3142* (2013.01); *H01L 23/49541* (2013.01); *H01L 23/49548* (2013.01); *H01L 23/49565* (2013.01); *H01L 23/49582* (2013.01); *H01L 23/3107* (2013.01)

(58) Field of Classification Search
 CPC ............. H01L 23/3142; H01L 23/3107; H01L 23/3121; H01L 24/97; H01L 23/4952; H01L 23/495; H01L 21/4825; H01L 2224/48247; H01L 23/28
 See application file for complete search history.

(56) References Cited

U.S. PATENT DOCUMENTS

| | | | |
|---|---|---|---|
| 2001/0041424 A1 | 11/2001 | Matsuura et al. | |
| 2004/0046240 A1 | 3/2004 | Hasebe et al. | |
| 2013/0277817 A1* | 10/2013 | Takeuchi | H01L 21/4821 257/676 |
| 2014/0124912 A1* | 5/2014 | Kaneda | H01L 23/49503 257/676 |
| 2015/0270197 A1 | 9/2015 | Taguchi | |
| 2016/0204055 A1* | 7/2016 | Heberle | H01L 21/561 257/774 |
| 2016/0254214 A1 | 9/2016 | Makino | |

FOREIGN PATENT DOCUMENTS

| | | |
|---|---|---|
| JP | 2004319996 A | 11/2004 |
| JP | 2008112961 A | 5/2008 |
| TW | 201216416 A1 | 4/2012 |
| TW | 2014408749 A | 3/2014 |
| TW | 201546987 A | 12/2015 |

* cited by examiner

SEMICONDUCTOR DEVICE HAVING OUTER TERMINAL PORTIONS WITH CONDUCTIVE LAYER ON OUTER END SURFACES AND METHOD OF MANUFACTURING A SEMICONDUCTOR DEVICE

CROSS-REFERENCE TO RELATED APPLICATIONS

This application is a continuation application of U.S. patent application Ser. No. 16/053,965 filed Aug. 3, 2018 and issued as U.S. Pat. No. 10,559,523 on Feb. 11, 2020, which is a continuation application of U.S. patent application Ser. No. 15/446,426 filed Mar. 1, 2017 and issued as U.S. Pat. No. 10,062,638 on Aug. 28, 2018, which claims the priority of Japanese Patent Application No. 2016-044341, filed on Mar. 8, 2016, in the JPO (Japan Patent Office), the entire contents of which are incorporated herein by reference.

FIELD

The present invention relates to a semiconductor package and a method for manufacturing the semiconductor package, and specifically, to a QFN-type semiconductor package (Quad Flat Non-lead Package) and a method for manufacturing such a semiconductor package.

BACKGROUND

Conventionally, a semiconductor package having a semiconductor device such as an IC chip or the like mounted on a lead frame is known as being usable for an electronic device such as a mobile phone, a smartphone or the like. Such a semiconductor package generally has a structure in which a semiconductor device such as an IC chip or the like is bonded on a lead frame with an adhesive layer and the semiconductor device is covered with a sealing member (formed of a sealing resin material) to be protected.

Recently, a QFN-type semiconductor package (Quad Flat Non-lead Package) having a connection terminal provided on four side surfaces and a bottom surface thereof has been developed (e.g., Japanese Laid-Open Patent Publication No. 2001-189410).

SUMMARY

Provided in an embodiment according to the present invention is a semiconductor package including a die pad; a plurality of external connection terminals located around the die pad; a semiconductor chip located on a top surface of the die pad and electrically connected with the plurality of external connection terminals; a plurality of wires respectively connecting the semiconductor chip and outer terminals of the plurality of external connection terminals with each other; and a sealing member covering the die pad, the plurality of external connection terminals and the semiconductor chip and exposing an outer terminal of each of the plurality of external connection terminals. A side surface of the outer terminal of each of the plurality of external connection terminals includes a first area, and the first area is plated.

Provided in an embodiment according to the present invention is a method for manufacturing a semiconductor package including preparing a lead frame including a plurality of regions to be separated from each other and to provide a plurality of semiconductor packages, the plurality of regions each including a die pad, a plurality of external connection terminals located around the die pad, a first coupling portion coupled with the die pad and coupling outer terminals of the plurality of external connection terminals to each other, and a second coupling portion coupling inner terminals of the plurality of external connection terminals to each other, the second coupling portion being thinned from a top surface thereof; locating a semiconductor chip on the die pad on a top surface of the lead frame, the semiconductor chip being electrically connected with the plurality of external connection terminals; forming a sealing member covering the die pad, the plurality of external connection terminals and the semiconductor chip and exposing the outer terminal of each of the plurality of external connection terminals; forming a first opening, by a die process, removing coupling portions at which the plurality of external connection terminals and the first coupling portion are coupled with each other; performing an electrolytic plating process to supply an electric current to the lead frame to form a plating layer on an exposed area of the lead frame; forming a groove separating the plurality of external connection terminals and the second coupling portion from a bottom surface of the lead frame; and separating the plurality of regions from each other by a die process to form the plurality of semiconductor packages.

Provided in an embodiment according to the present invention is a method for manufacturing a semiconductor package including preparing a lead frame including a plurality of regions to be separated from each other to provide a plurality of semiconductor packages, the plurality of regions each including a die pad, a plurality of external connection terminals located around the die pad, and a first coupling portion coupled with the die pad and coupling outer terminals of the plurality of external connection terminals to each other, the first coupling portion having a first opening located along the outer terminals of the plurality of external connection terminals; locating a semiconductor chip on the die pad on a top surface of the lead frame, the semiconductor chip being electrically connected with the plurality of external connection terminals; forming a sealing member covering the die pad, the plurality of external connection terminals and the semiconductor chip and exposing the outer terminal of each of the plurality of external connection terminals; performing an electrolytic plating process to supply an electric current to the lead frame to form a plating layer on an exposed area of the plurality of external connection terminals; and separating the plurality of regions from each other by a die process to form the plurality of semiconductor packages and separating the plurality of external connection terminals from each other such that each of the plurality of external connection terminals includes, in a side surface, a part of a side wall of the first opening.

Provided in an embodiment according to the present invention is a method for manufacturing a semiconductor package including preparing a lead frame including a plurality of regions to be separated from each other to provide a plurality of semiconductor packages, the plurality of regions being demarcated by a dicing line and each including a die pad, a plurality of external connection terminals located around the die pad, and a first coupling portion coupled with the die pad and coupling outer terminals of the plurality of external connection terminals to each other; locating a semiconductor chip on the die pad on a top surface of the lead frame, the semiconductor chip being electrically connected with the plurality of external connection terminals; forming a sealing member covering the die pad, the plurality of external connection terminals and the semiconductor chip and exposing the outer terminal of each of the plurality of external connection terminals; at least partially thinning the outer terminal of each of the plurality of external connection terminals from a bottom surface thereof by a cutting process; performing an electrolytic plating process to supply an electric current to the lead frame to form a plating layer on an exposed area of the plurality of external connection terminals; and separating the plurality of regions from each other by a cutting process.

DESCRIPTION OF EMBODIMENTS

Figure 1A:
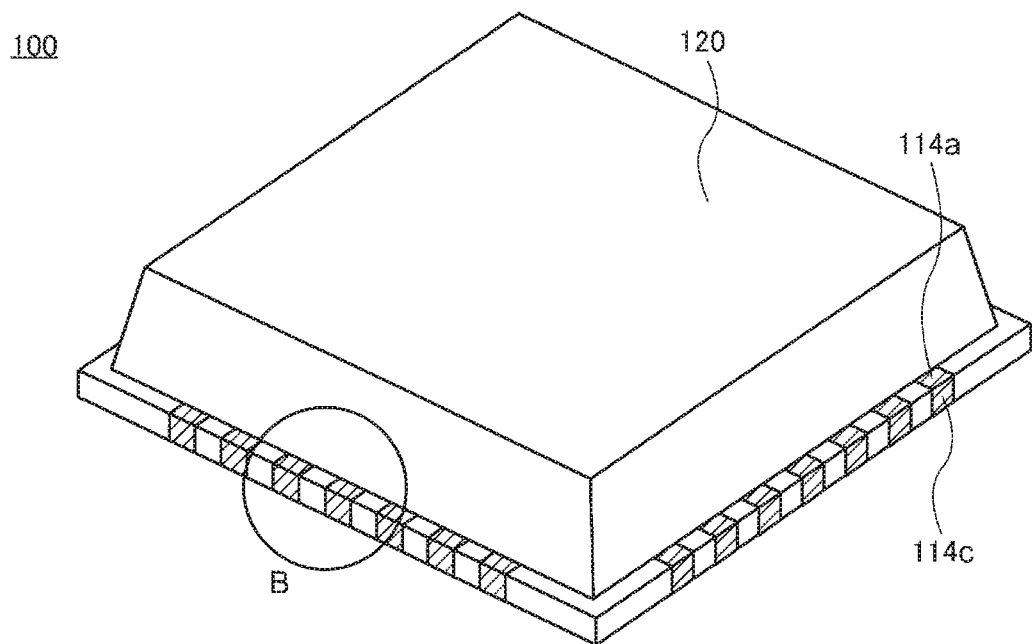
FIG. 1A is a perspective view showing a structure of a semiconductor package in an embodiment according to the present invention.

Hereinafter, embodiments of the present invention will be described with reference to the drawings and the like. The present invention may be carried out in many different forms, and is not to be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the interpretations of the present invention in any way. In the specification and the drawings, components that are substantially the same as those shown in a previous drawing(s) bear the identical reference signs thereto, and detailed descriptions thereof may be omitted.

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

Embodiment 1

[Structure of Semiconductor Package 100]

A semiconductor package 100 in this embodiment will be described in detail with reference to the drawings.

Figure 1B:
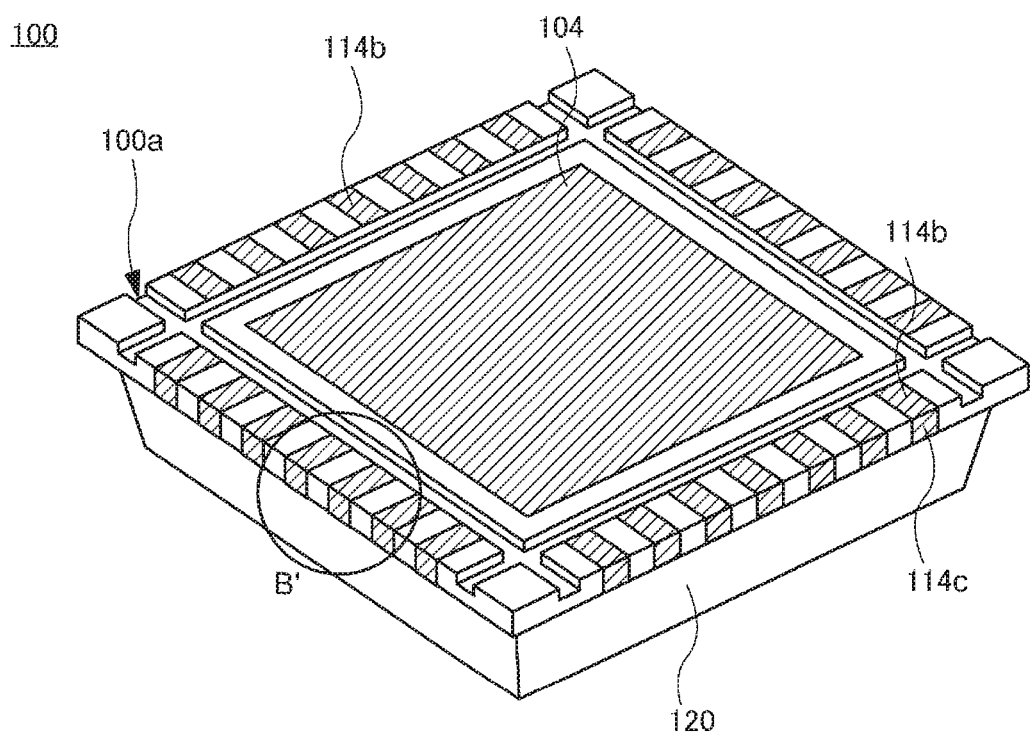
FIG. 1B is a perspective view showing the structure of the semiconductor package in the embodiment according to the present invention.
Figure 13A:
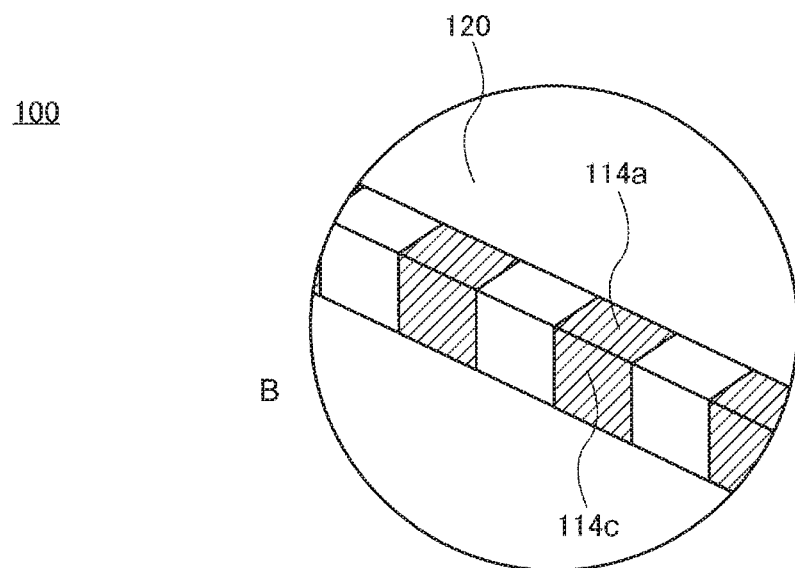
FIG. 13A is an enlarged perspective view showing the structure of the semiconductor package in one of the embodiments according to the present invention.
Figure 13B:
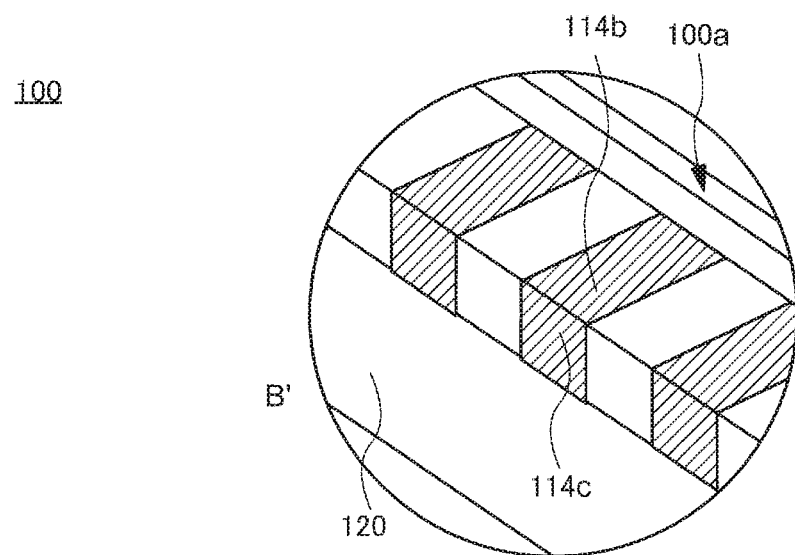
FIG. 13B is an enlarged perspective view showing the structure of the semiconductor package in one of the embodiments according to the present invention.

FIG. 1A and FIG. 1B are each a perspective view showing a structure of the semiconductor package 100 in this embodiment. FIG. 13A and FIG. 13B are respectively enlarged views of area B in FIG. 1A and area B' in FIG. 1B, more specifically are enlarged views of external connection terminals 114 and the vicinity thereof. FIG. 1A and FIG. 13A each show the structure of the semiconductor package 100 as seen from above, and FIG. 1B and FIG. 13B each show the structure of the semiconductor package 100 as seen from below. The semiconductor package 100 in this embodiment is a QFN-type semiconductor package (Quad Flat Non-lead Package). The semiconductor package 100 has a rectangular bottom surface and includes a plurality of (seven in this example) external connection terminals 114 (FIG. 2A and FIG. 2B) provided along each of four sides thereof. A side surface 114c and a bottom surface 114b of each of the plurality of external connection terminals 114 are exposed. A plating layer 122 (FIG. 2A and FIG. 2B) is formed on the side surface 114c and the bottom surface 114b, which are exposed, of each external connection terminal 114. The semiconductor package 100 also has four grooves 100a provided along the four sides of the bottom surface thereof. The four grooves 100a are each provided adjacent to the seven external connection terminals 114. In this specification, the term "rectangular" encompasses "square".

Figure 2A:
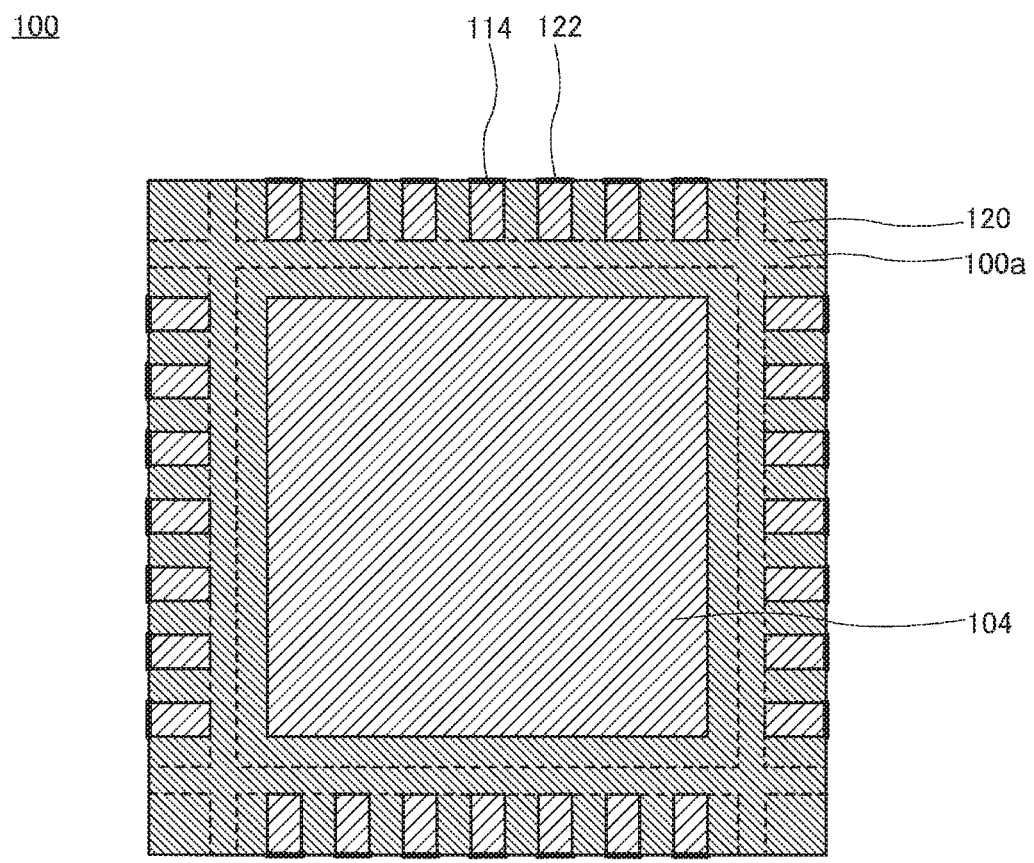
FIG. 2A is a bottom view showing the structure of the semiconductor package in the embodiment according to the present invention.
Figure 2B:
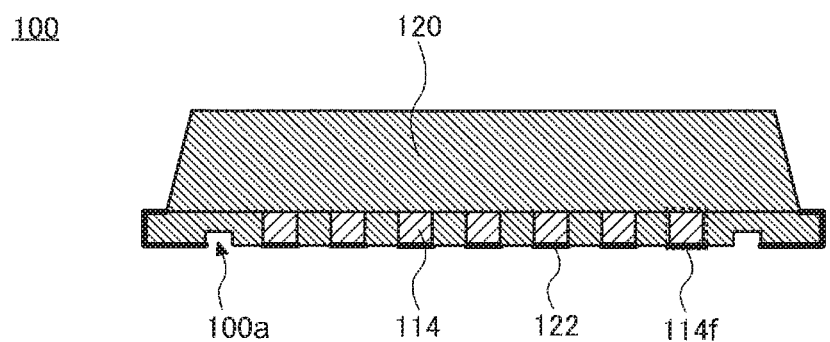
FIG. 2B is a side view showing the structure of the semiconductor package in the embodiment according to the present invention.
Figure 3A:
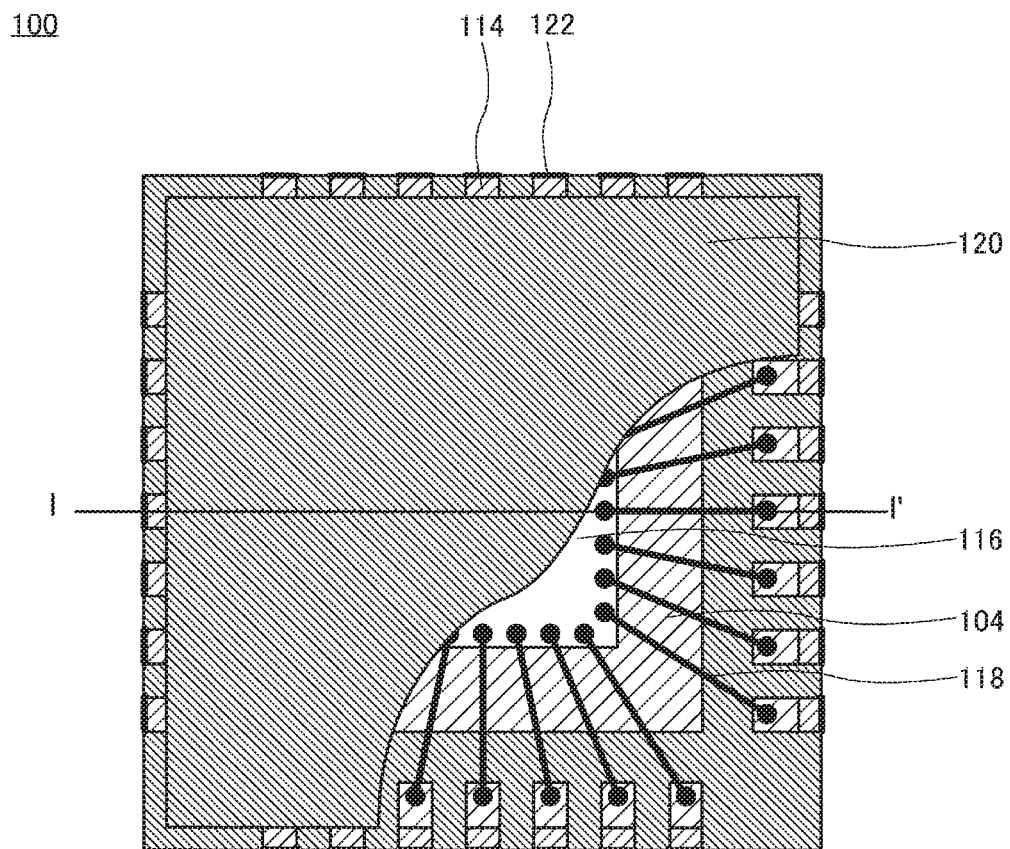
FIG. 3A is a plan view showing the structure of the semiconductor package in the embodiment according to the present invention.
Figure 3B:
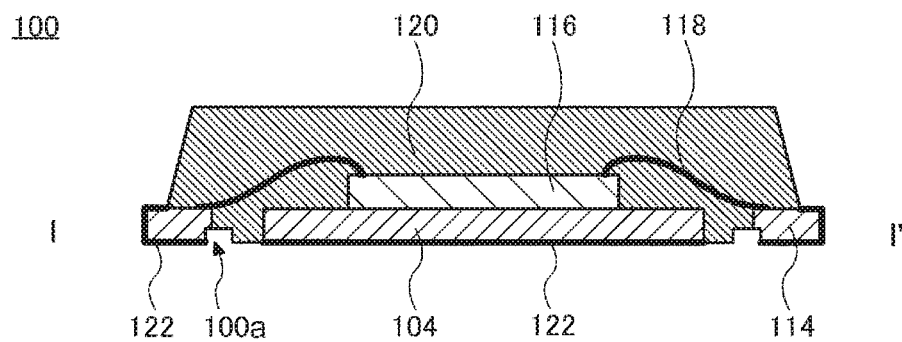
FIG. 3B is a cross-sectional view showing the structure of the semiconductor package in the embodiment according to the present invention.
Figure 4A:
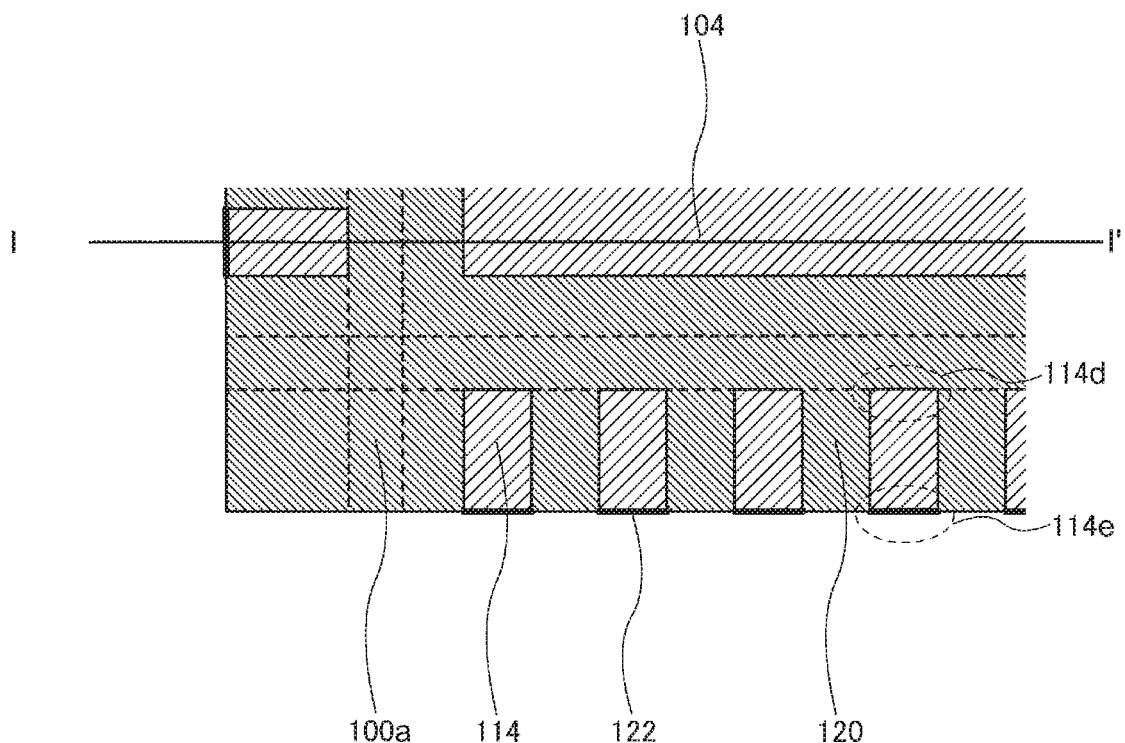
FIG. 4A is an enlarged bottom view showing the structure of the semiconductor package in the embodiment according to the present invention.
Figure 4B:
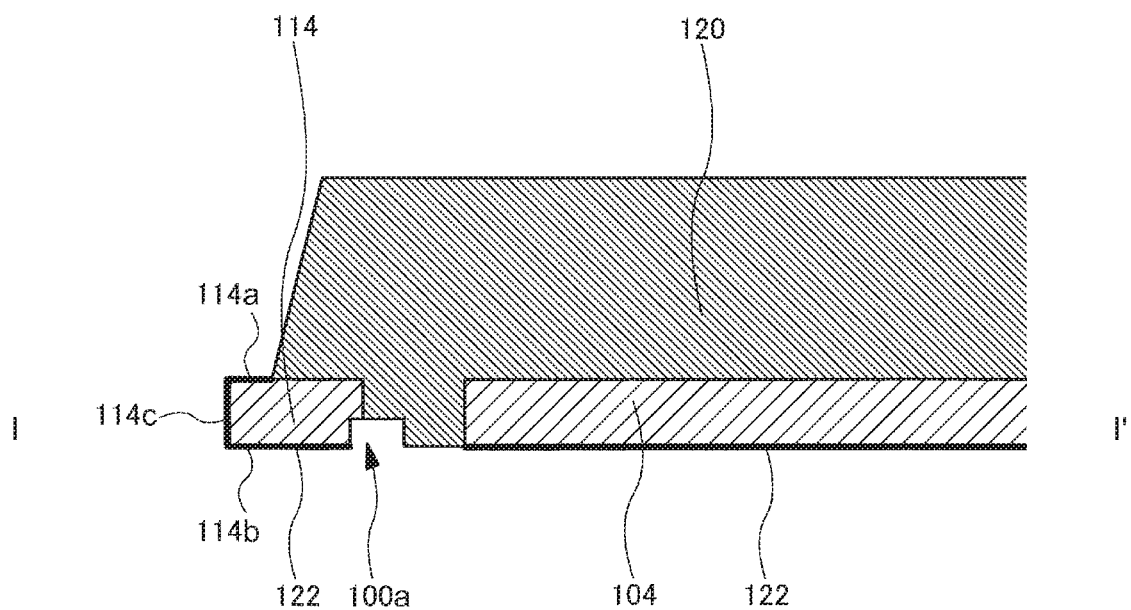
FIG. 4B is an enlarged cross-sectional view showing the structure of the semiconductor package in the embodiment according to the present invention.

FIG. 2A and FIG. 2B are respectively a bottom view and a side view showing the structure of the semiconductor package 100 in this embodiment. FIG. 3A and FIG. 3B are respectively a plan view and a cross-sectional view showing the structure of the semiconductor package 100 in this embodiment. FIG. 4A and FIG. 4B are respectively an enlarged bottom view and an enlarged cross-sectional view showing the structure of the semiconductor package 100 in this embodiment. FIG. 3A shows the semiconductor package 100 with a part of a sealing member 120 being cut off in order to show a semiconductor chip 116 and the like sealed therein. FIG. 3B and FIG. 4B are taken along line I-I' in FIG. 3A and FIG. 4A respectively.

The semiconductor package 100 in this embodiment includes a die pad 104 the plurality of external connection terminals 114, the semiconductor chip 116, a plurality of wires 118 (FIG. 5D), and the sealing member 120.

The die pad 104 has a top surface, a bottom surface and a side surface. The top surface and the bottom surface are on flat planes substantially parallel to each other. In this embodiment, as seen from, for example, FIG. 3A, FIG. 3B, FIG. 4A and FIG. 4B, the top surface and the side surface of the die pad 104 are not visually recognized from outside because of the sealing member 120, and the bottom surface of the die pad 104 is exposed. The plating layer 122 is provided on the exposed bottom surface of the die pad 104. The plating layer 122 may be of the same type as that provided on the side surface 114c of each external connection terminal 114 as described below in detail.

It is preferable that the die pad 104 is formed of a metal material having high mechanical strength, high electric conductivity, high heat conductivity, high resistance against corrosion and the like. A specific metal material usable for the die pad 104 is, for example, a Cu (copper)-based material. An example of the Cu-based material is an alloy of Cu containing Fe (iron), P (phosphorus) or the like. Another specific metal material usable for the die pad 104 may be an Fe (iron)-based material. An example of the Fe-based material is Fe containing Ni (nickel) or the like.

As seen from, for example, FIG. 3A and FIG. 3B, the plurality of external connection terminals 114 are located around the die pad 104. In this embodiment, as shown in FIG. 4A, each of the plurality of external connection terminals 114 has a rectangular shape and includes an inner terminal 114d close to the die pad 104 and an outer terminal 114e farther from the die pad 104 than the inner terminal 114d is. The external connection terminals 114 are not limited to being rectangular. For example, the outer terminal 114e may include a protruding portion or a curved portion.

As shown in the cross-sectional view of FIG. 4B, each of the external connection terminals 114 includes a top surface 114a, the bottom surface 114b, and the side surface 114c. The top surface 114a and the bottom surface 114b are on flat planes substantially parallel to each other. The side surface 114c is a part of the entire surface of each external connection terminal 114 excluding the top surface 114a and the bottom surface 114b.

The bottom surface 114b and the side surface 114c of each external connection terminal 114 are exposed. The plating layer 122 is provided on the exposed bottom surface 114b. The exposed side surface 114c of the outer terminal 114e includes a first region 114f (FIG. 2B). In this embodiment, the first region 114f corresponds to the side surface 114c of the outer terminal 114e. The plating layer 122 is provided on the first region 114f. A preferable material for the plating layer 122 is a metal material that improves the solder wettability and decreases the electric resistance between an external line such as, for example, a line of a printed circuit board on which the semiconductor package 100 is to be mounted and the external connection terminals 114. A specific example of the material for the plating layer 122 may be Sn (tin), or Sn containing a metal material such as Ag (silver), Cu (copper), Bi (bismuth) or the like.

As described below regarding a method for manufacturing the semiconductor package 100, the plurality of external connection terminals 114 are cut out from a lead frame 102 on which the die pad 104 is provided, and therefore, are formed of the same material as that of the die pad 104.

The semiconductor chip 116 is located on a top surface of the die pad 104 and is electrically connected with the plurality of external connection terminals 114. The semiconductor chip 116 is secured to the top surface of the die pad 104 with an adhesive (not shown). On the semiconductor chip 116, an external terminal (not shown) connected with an electronic circuit included in the semiconductor chip 116 is provided. In this embodiment, the semiconductor package 100 includes one semiconductor chip 116. The semiconductor package 100 is not limited to including one semiconductor chip 116, and may include at least one semiconductor chip 116.

Usable as the semiconductor chip 116 may be, for example, a central processing unit (CPU), a memory, a micro electromechanical system (MEMS) or the like.

The plurality of wires 118 respectively connect the semiconductor chip 116 and the plurality of external connection terminals 114 with each other. It is preferable that the wires 118 are formed of a material having a required conductivity and a required connectability. Preferably, the wires 118 are formed of, for example, gold wires or copper wires.

The sealing member 120 covers the die pad 104, the plurality of external connection terminals 114, and the semiconductor chip 116. The sealing member 120 exposes the outer terminal 114e of each of the plurality of external connection terminals 114.

Regarding each external connection terminal 114 in the semiconductor package 100 in this embodiment, the plating layer 122 is provided on the bottom surface 114b and also the side surface 114c of the outer terminal 114e, which are both exposed. Such a structure improves the solder wettability at the side surface 114c of the outer terminal 114e of each external connection terminal 114. Thus, when the semiconductor package 100 is mounted on a printed circuit board or the like by solder, a good fillet is formed.

In a conventional QFN-type semiconductor package, a bottom surface of a connection terminal is plated. By contrast, a side surface of the connection terminal is not plated and Cu (copper) is exposed. Therefore, when a semiconductor package is mounted on a printed circuit board or the like with solder, the solder wettability at the side surface of the connection terminal is lower than that at the bottom surface. For this reason, it is difficult to form a good fillet in such a conventional semiconductor package.

[Method for Manufacturing the Semiconductor Package 100]

Figure 5A:
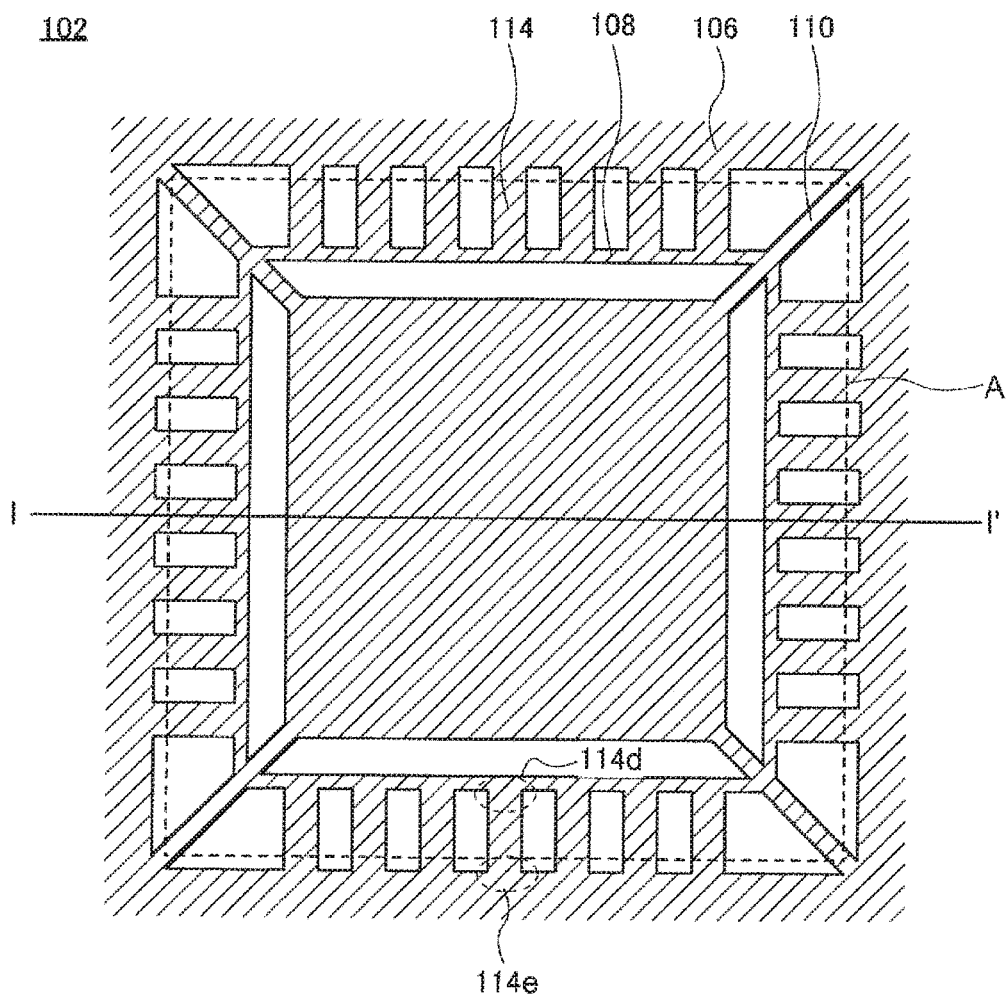
FIG. 5A is a plan view showing a step of a method for manufacturing the semiconductor package in the embodiment according to the present invention.

A method for manufacturing the semiconductor package 100 in this embodiment will be described in detail with reference to the drawings. FIG. 5A through FIG. 5R show the method for manufacturing the semiconductor package 100 in this embodiment. FIG. 5A, FIG. 5C, FIG. 5E, FIG. 5G, FIG. 5K and FIG. 5O are plan views showing steps of the method for manufacturing the semiconductor package 100 in this embodiment. FIG. 5B, FIG. 5D, FIG. 5F, FIG. 5H, FIG. 5L and FIG. 5P are cross-sectional views showing the steps of the method for manufacturing the semiconductor package 100 in this embodiment, respectively corresponding to FIG. 5A, FIG. 5C, FIG. 5E, FIG. 5G, FIG. 5K and FIG. 5O. FIG. 5I, FIG. 5M and FIG. 5Q are enlarged bottom views respectively in the steps shown in FIG. 5G and FIG.

5H, FIG. 5K and FIG. 5L, and FIG. 5O and FIG. 5P. FIG. 5J, FIG. 5N and FIG. 5R are enlarged cross-sectional views respectively corresponding to FIG. SI, FIG. 5M and FIG. 5Q. FIG. 5B, FIG. 5D, FIG. 5F, FIG. 5H, FIG. 5J, FIG. 5L, FIG. 5N and FIG. 5P are taken along line I-I' in FIG. 5A, FIG. 5C, FIG. 5E, FIG. 5G, FIG. 5I, FIG. 5K, FIG. 5M and FIG. 5O respectively.

First, a structure of the lead frame 102 used to manufacture the semiconductor package 100 in this embodiment will be described in detail.

Figure 5B:
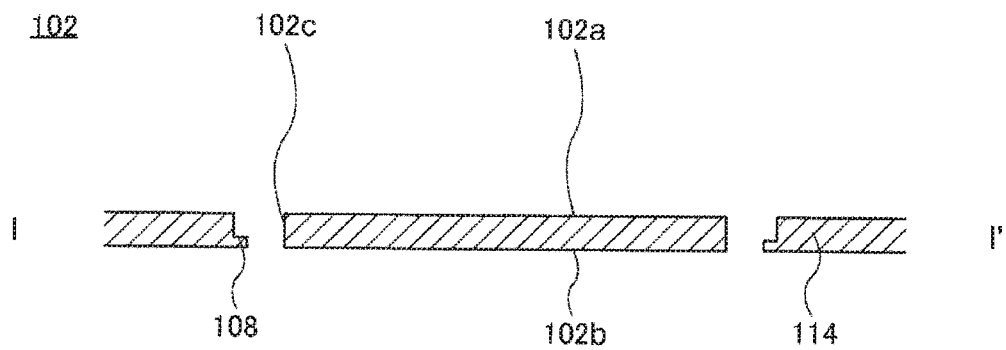
FIG. 5B is a cross-sectional view showing the step of the method for manufacturing the semiconductor package in the embodiment according to the present invention.

FIG. 5A and FIG. 5B are respectively a plan view and a cross-sectional view of the lead frame 102 used to manufacture the semiconductor package 100 in this embodiment. The lead frame 102 is formed of a metal plate, and includes a plurality of regions A (only one is shown in FIG. 5A and FIG. 5B). The lead frame 102 is to be divided into the plurality of regions A, and each of the plurality of regions A is used to provide the semiconductor package 100.

The lead frame 102 has a top surface 102a, a bottom surface 102b and a side surface 102c. The top surface 102a and the bottom surface 102b are on flat planes substantially parallel to each other. The side surface 102c is a part of the entire surface of the lead frame 102 (i.e., metal plate) excluding the top surface 102a and the bottom surface 102b. The thickness of the lead frame 102 corresponds to the thickness of the metal plate, and is 100 µm or greater and 600 µm or less. In this embodiment, the lead frame 102 has a thickness of 200 µm.

It is preferable that the lead frame 102 is formed of a metal material having high mechanical strength, high electric conductivity, high heat conductivity, high resistance against corrosion and the like. A specific metal material usable for the lead frame 102 is, for example, a Cu (copper)-based material. An example of the Cu-based material is an alloy of Cu containing Fe (iron), P (phosphorus) or the like. Another specific metal material usable for the metal frame 102 may be an Fe (iron)-based material. An example of the Fe-based material is Fe containing Ni (nickel) or the like.

The metal plate may be subjected to a process including etching or punching performed by use of a die, to be formed into the lead frame 102 described below.

The plurality of regions A each include the die pad 104, the plurality of external connection terminals 114, a first coupling portion 106 and a second coupling portion 108.

The die pad 104 is rectangular and flat, and is located at substantially the center of each of the plurality of regions A. A third coupling portion 110 extends from each of four corners of the rectangular die pad 104 and is connected with the first coupling portion 106.

The plurality of external connection terminals 114 are located around the die pad 104. Each of the plurality of external connection terminals 114 includes the inner terminal 114d close to the die pad 104 and the outer terminal 114e farther from the die pad 104 than the inner terminal 114d is. On the stage of preparing the lead frame 102, the inner terminal 114d is connected with the second coupling portion 108 described below, and the outer terminal 114e is connected with the first coupling portion 106 described below, and therefore, neither the side surface of the inner terminal 114d nor the side surface of the outer terminal 114e is exposed. In this embodiment, 28 external connection terminals 114 are provided.

The first coupling portion 106 is located along borders between the plurality of regions A. Namely, the first coupling portion 106 is located in a lattice in the lead frame 102. Therefore, the first coupling portion 106 is located along four sides of each of the plurality of regions A, which are rectangular.

The first coupling portion 106 is coupled with the die pad 104. As described above, the third coupling portions 110 radially extend respectively from the four corners of the rectangular die pad 104 and are connected with the first coupling portion 106.

The first coupling portion 106 couples the outer terminals 114e of the plurality of external connection terminals 114 with each other. In other words, the outer terminals 114e of the plurality of external connection terminals 114 are coupled with the first coupling portion 106. In this embodiment, seven external connection terminals 114 are coupled with a portion of the coupling portion 106 located along each of the four sides of each region A. Thus, 28 external connection terminals 114 are coupled around each region A.

The second coupling portion 108 couples the inner terminals 114d of the plurality of external connection terminals 114 with each other. In other words, the inner terminals 114d of the plurality of external connection terminals 114 are coupled with the second coupling portion 108. The second coupling portion 108 is located around the die pad 104, and is coupled with the third coupling portions 110.

In this embodiment, the second coupling portion 108 is located around the rectangular die pad 104, and couples the third coupling portions 110 adjacent to each other. A portion of the second coupling portion 108 coupling each two third coupling portions 110 adjacent to each other is connected with the inner terminals 114d of seven external connection terminals 114.

The second coupling portion 108 is thinner than the metal plate used to form the lead frame 102. In this embodiment, the second coupling portion 108 is thinned from the top surface 102a or the bottom surface 102b (in this example, the top surface 102a). The second coupling portion 108 has a thickness of, for example, 100 µm.

The components of the lead frame 102 in this embodiment are coupled with each other physically and electrically.

So far, the structure of the lead frame 102 used to manufacture the semiconductor package 100 in this embodiment has been described. Now, the method for manufacturing the semiconductor package 100 in this embodiment will be described in detail.

First, the above-described lead frame 102 is prepared (FIG. 5A and FIG. 5B).

Figure 5C:
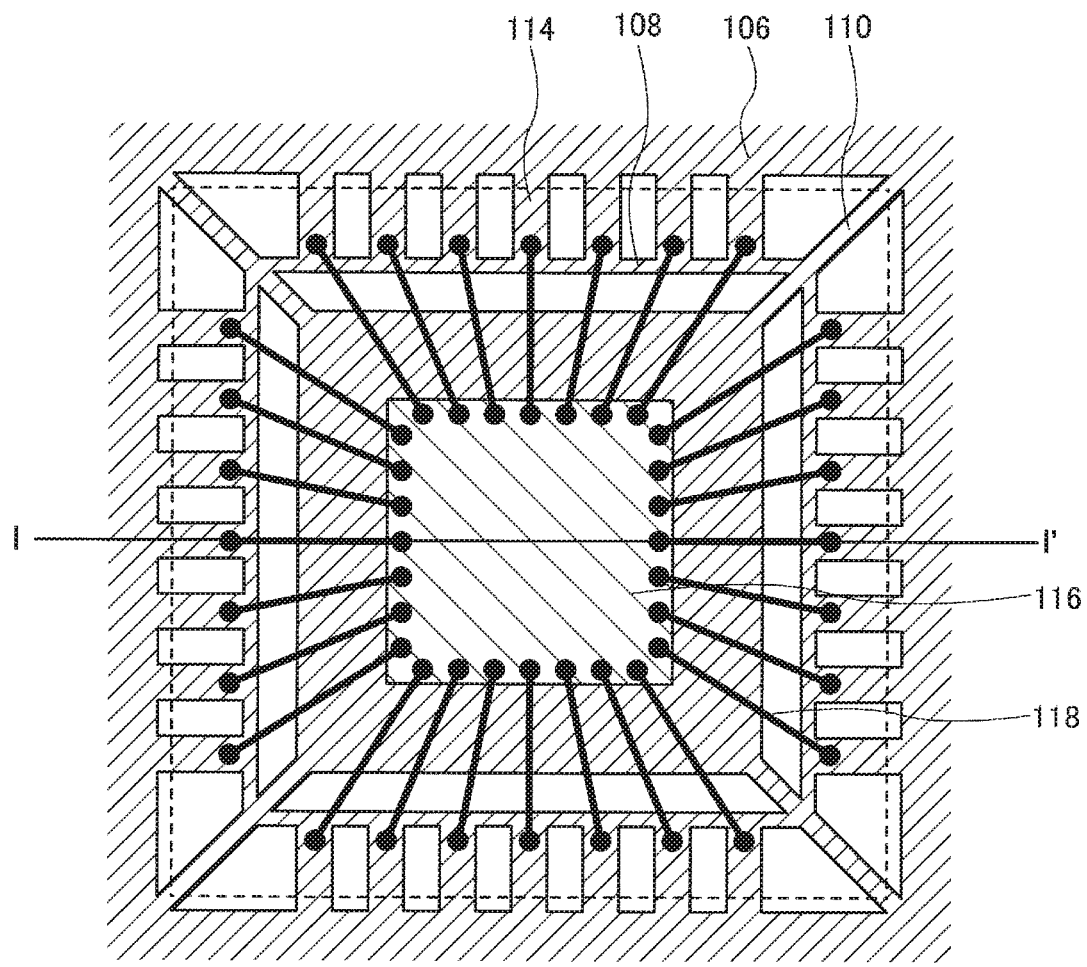
FIG. 5C is a plan view showing a step of the method for manufacturing the semiconductor package in the embodiment according to the present invention.
Figure 5D:
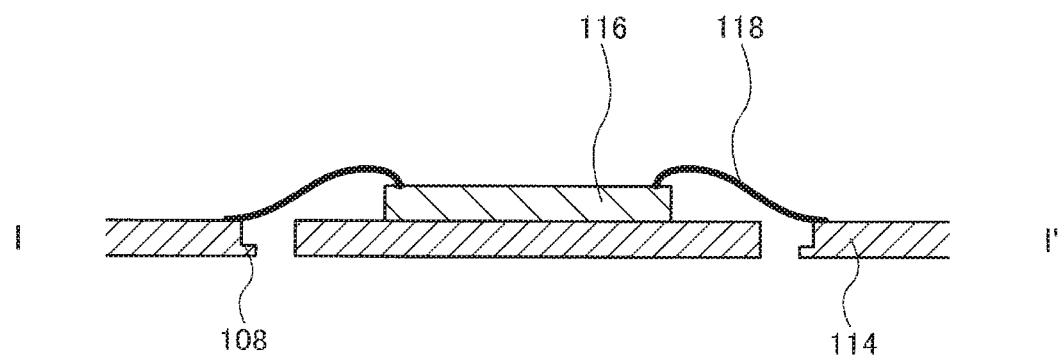
FIG. 5D is a cross-sectional view showing the step of the method for manufacturing the semiconductor package in the embodiment according to the present invention.

Next, the semiconductor chip 116 is located on the die pad 104 on the top surface 102a of the lead frame 102. The semiconductor chip 116 is electrically connected with the plurality of external connection terminals 114. In this embodiment, the semiconductor chip 116 and the plurality of external connection terminals 114 are connected with each other by the wires 118 respectively (FIG. 5C and FIG. 5D).

Figure 5E:
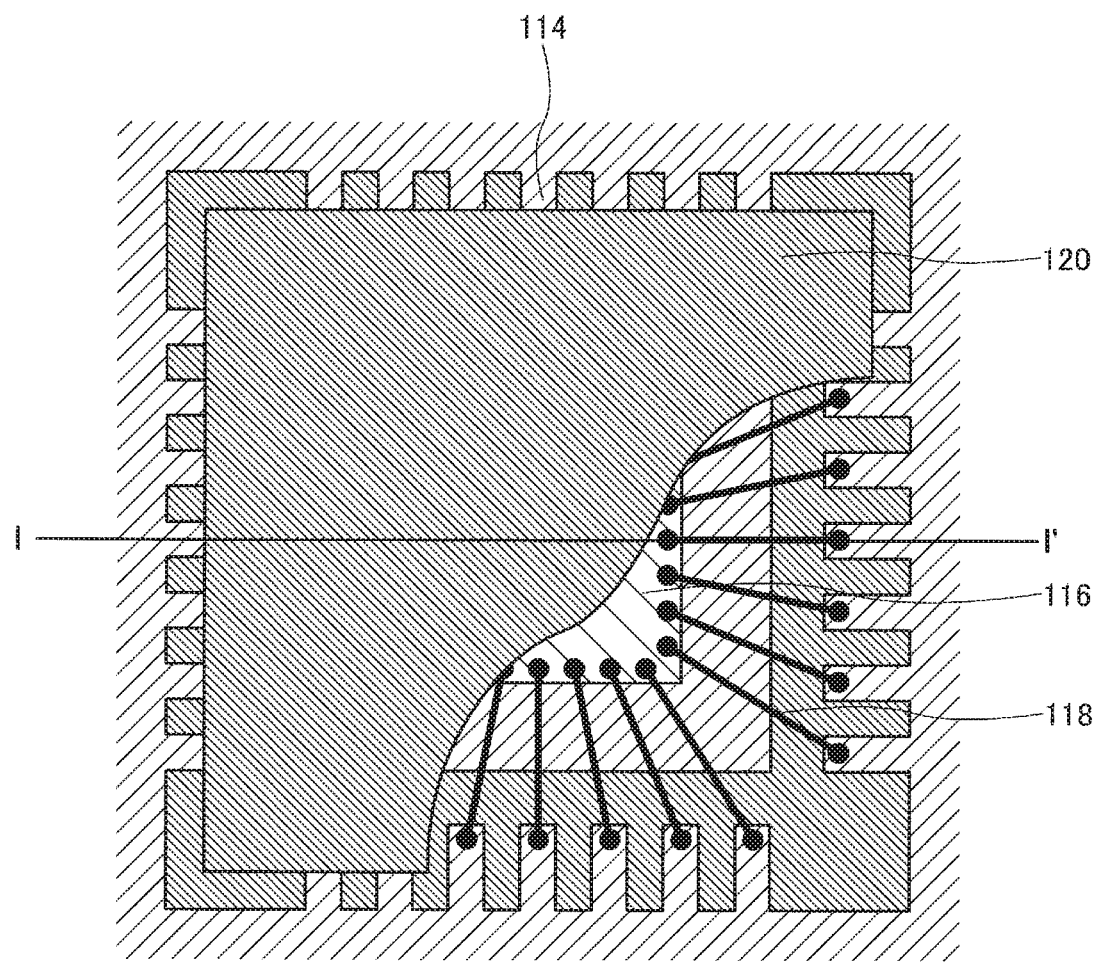
FIG. 5E is a plan view showing a step of the method for manufacturing the semiconductor package in the embodiment according to the present invention.
Figure 5F:
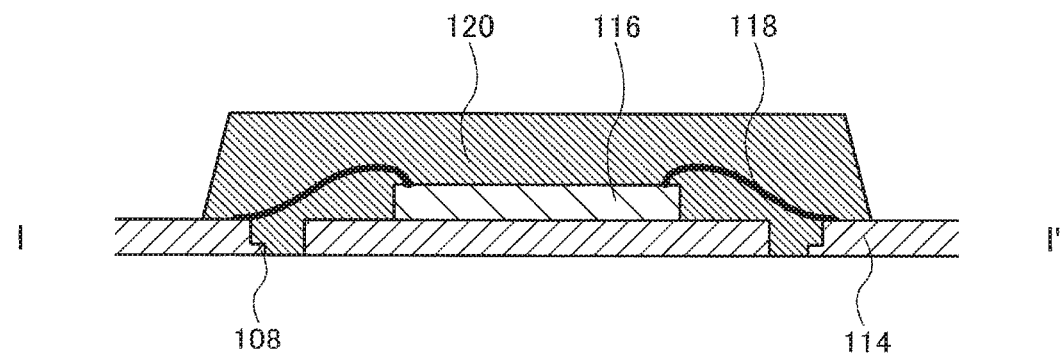
FIG. 5F is a cross-sectional view showing the step of the method for manufacturing the semiconductor package in the embodiment according to the present invention.
Figure 5G:
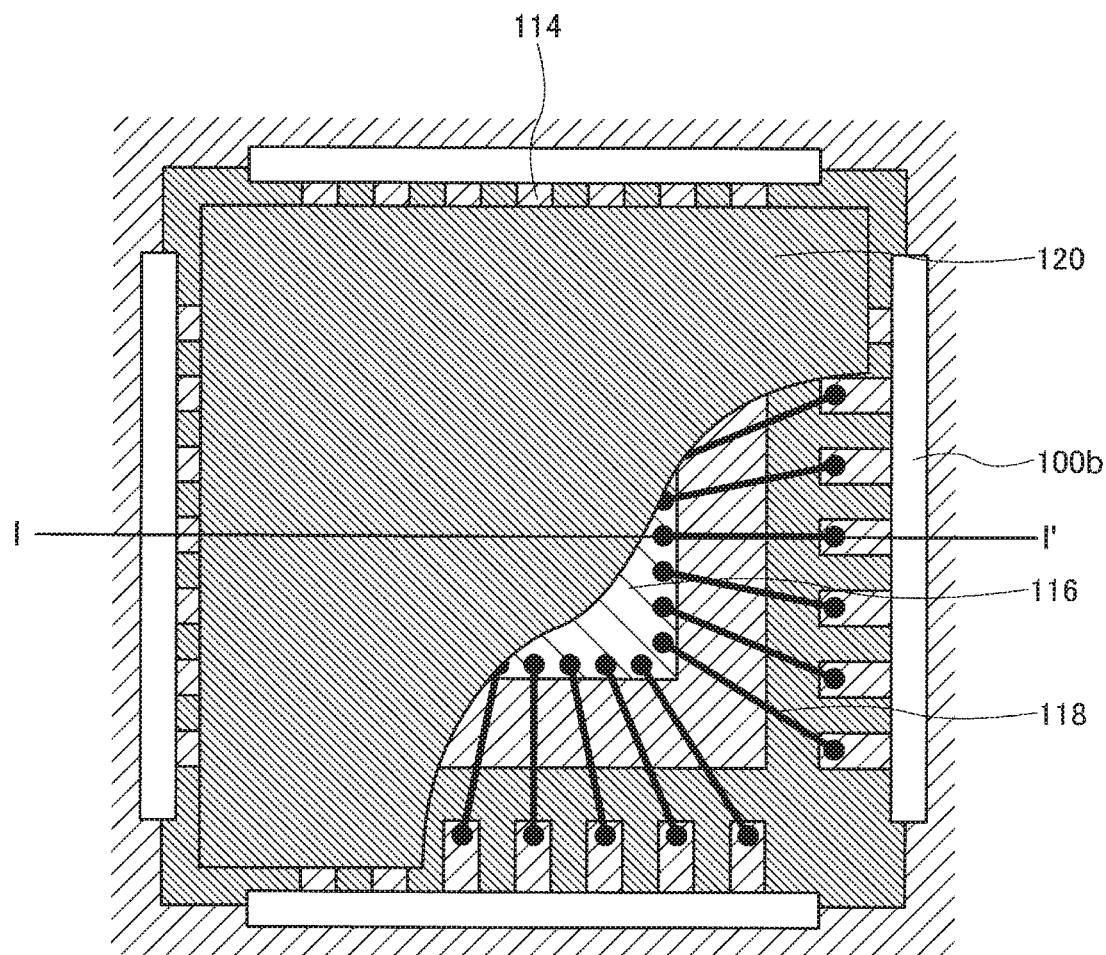
FIG. 5G is a plan view showing a step of the method for manufacturing the semiconductor package in the embodiment according to the present invention.
Figure 5H:
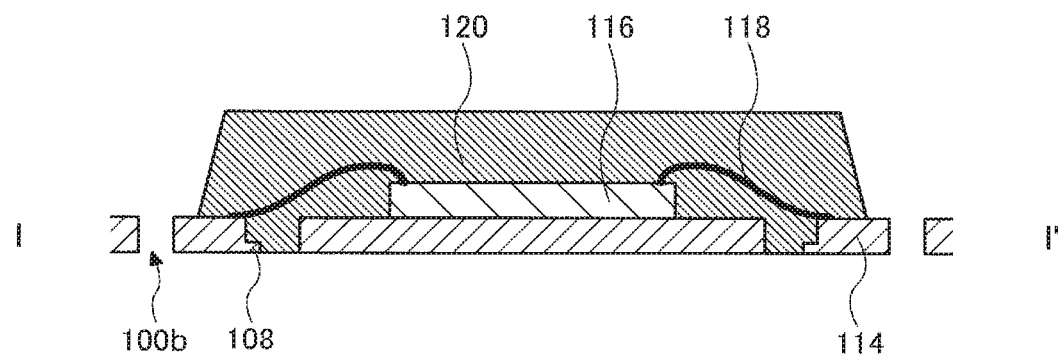
FIG. 5H is a cross-sectional view showing the step of the method for manufacturing the semiconductor package in the embodiment according to the present invention.
Figure 5I:
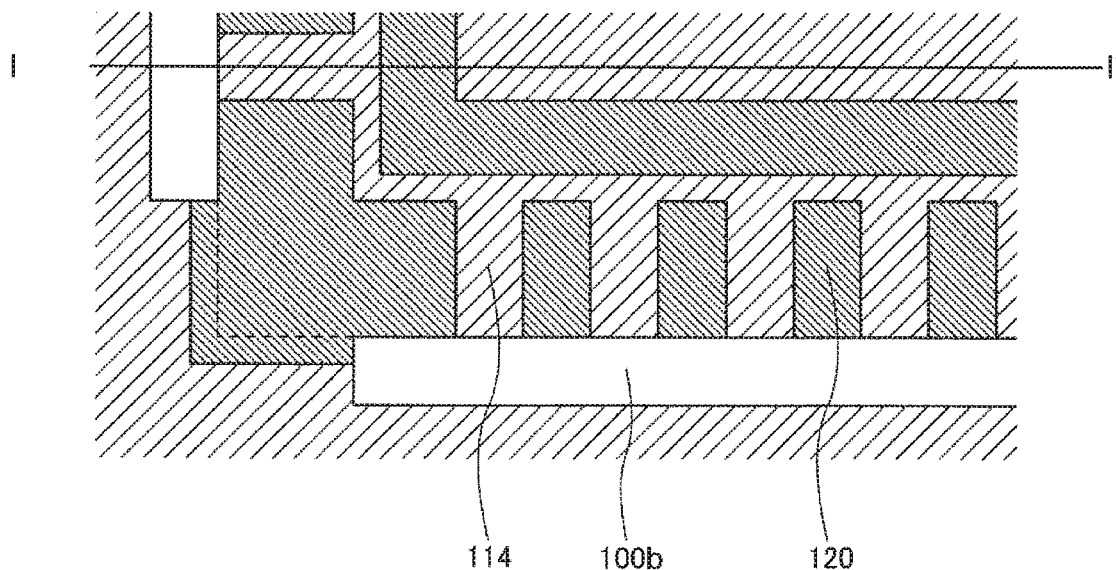
FIG. 5I is an enlarged bottom view showing the step of the method for manufacturing the semiconductor package in the embodiment according to the present invention.
Figure 5J:
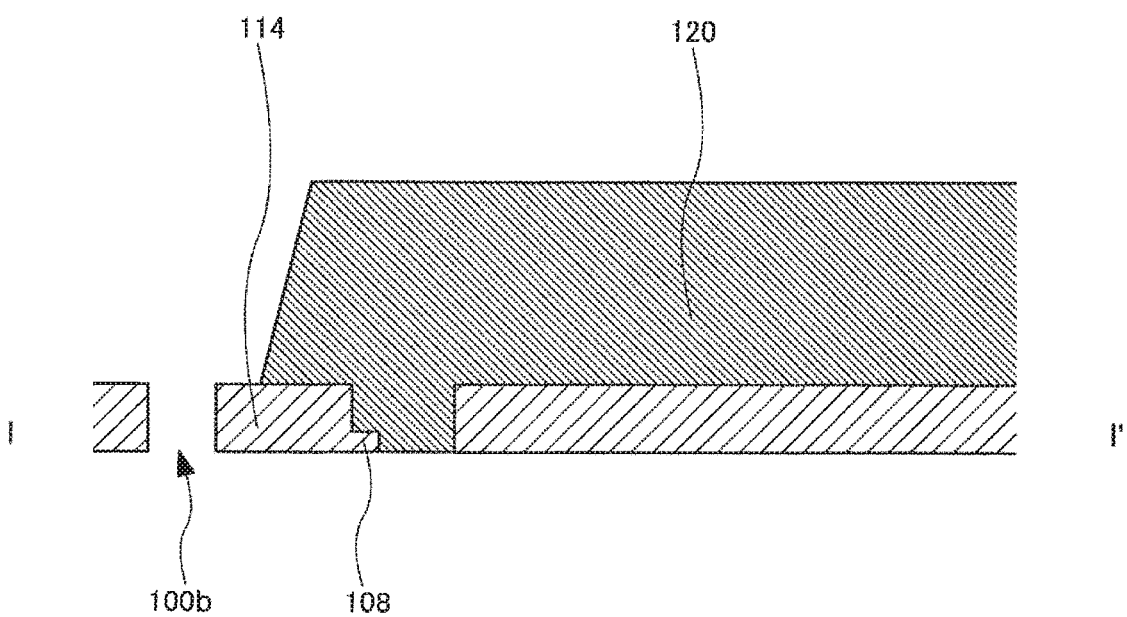
FIG. 5J is an enlarged cross-sectional view showing the step of the method for manufacturing the semiconductor package in the embodiment according to the present invention.
Figure 5K:
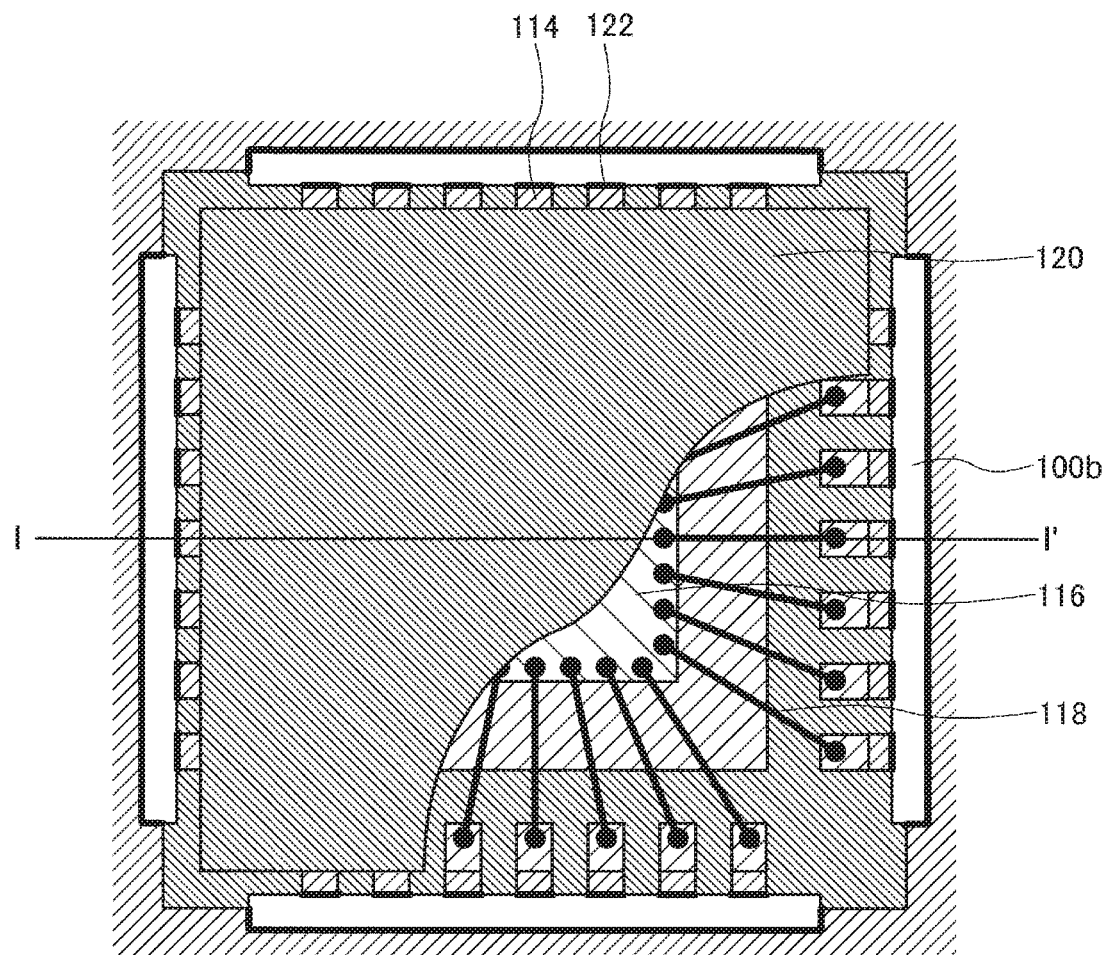
FIG. 5K is a plan view showing a step of the method for manufacturing the semiconductor package in the embodiment according to the present invention.
Figure 5L:
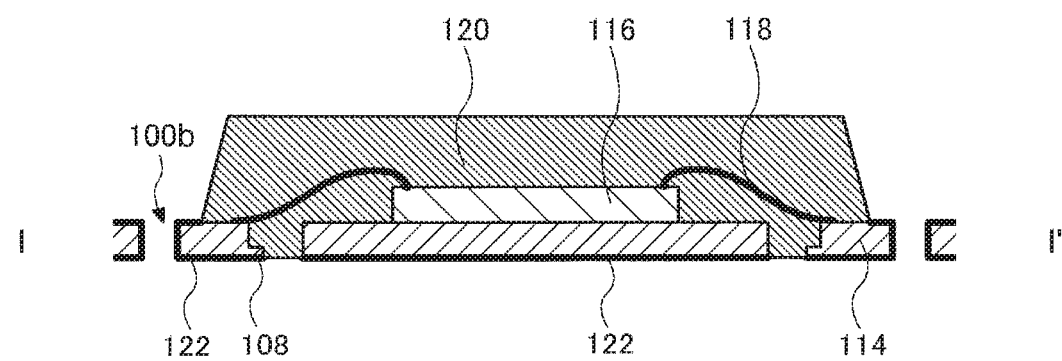
FIG. 5L is a cross-sectional view showing the step of the method for manufacturing the semiconductor package in the embodiment according to the present invention.
Figure 5M:
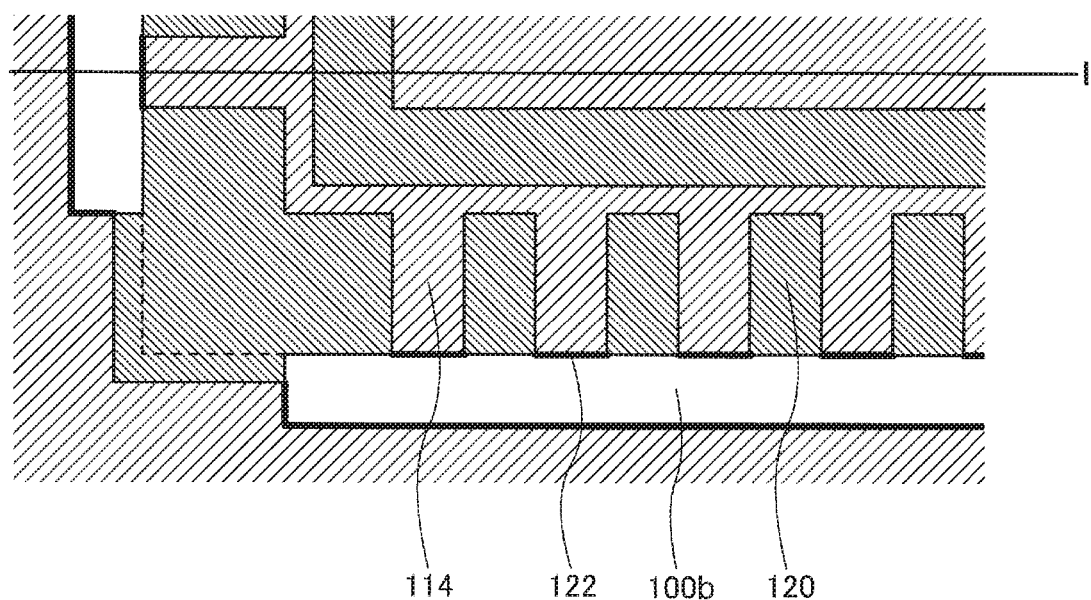
FIG. 5M is an enlarged bottom view showing the step of the method for manufacturing the semiconductor package in the embodiment according to the present invention.
Figure 5N:
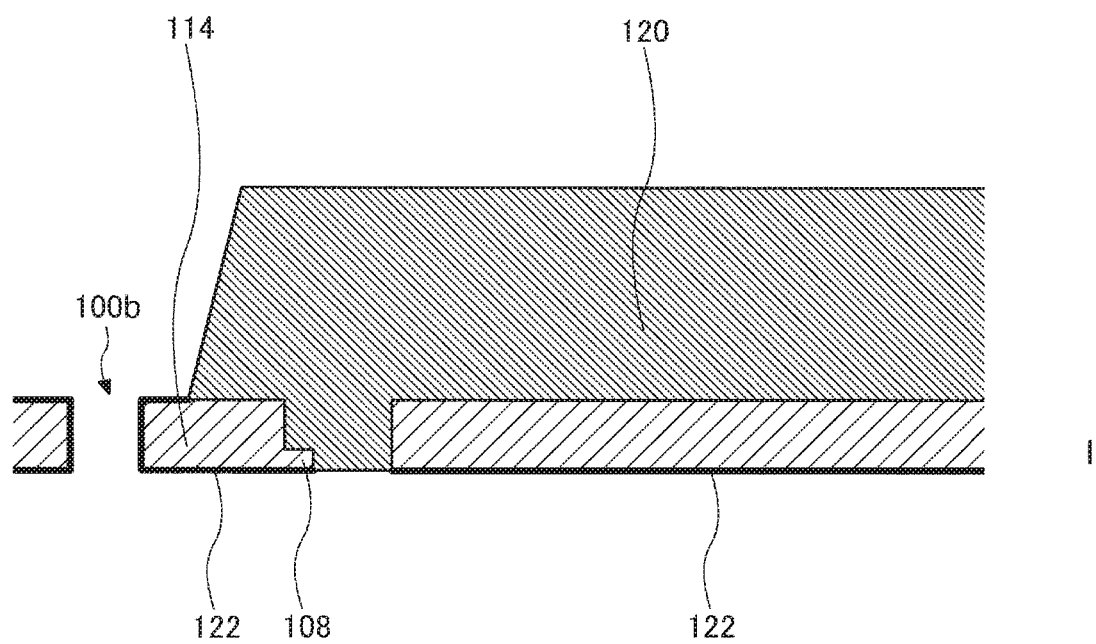
FIG. 5N is an enlarged cross-sectional view showing the step of the method for manufacturing the semiconductor package in the embodiment according to the present invention.
Figure 5O:
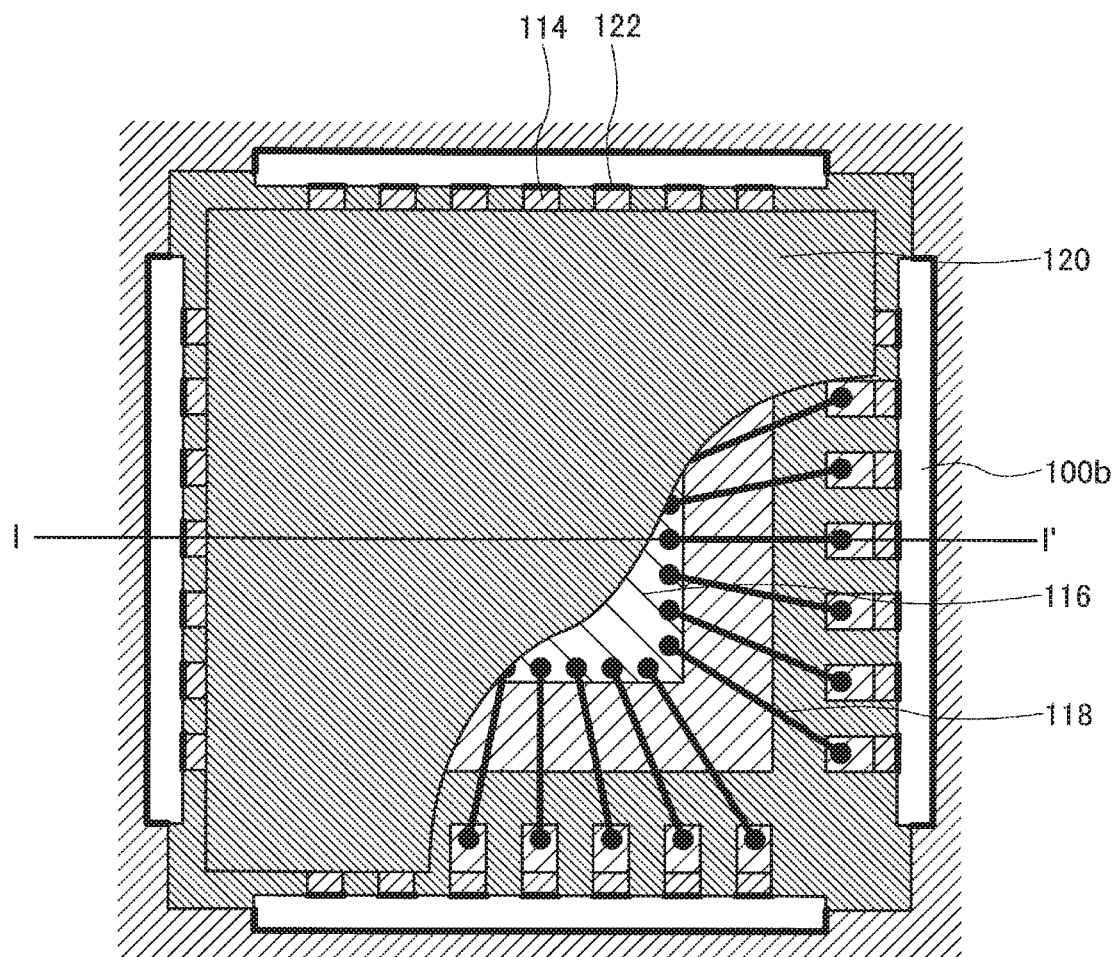
FIG. 5O is a plan view showing a step of the method for manufacturing the semiconductor package in the embodiment according to the present invention.
Figure 5P:
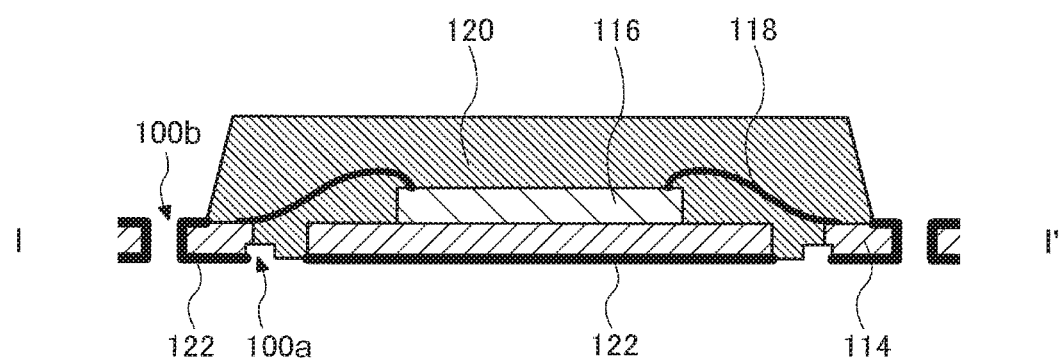
FIG. 5P is a cross-sectional view showing the step of the method for manufacturing the semiconductor package in the embodiment according to the present invention.
Figure 5Q:
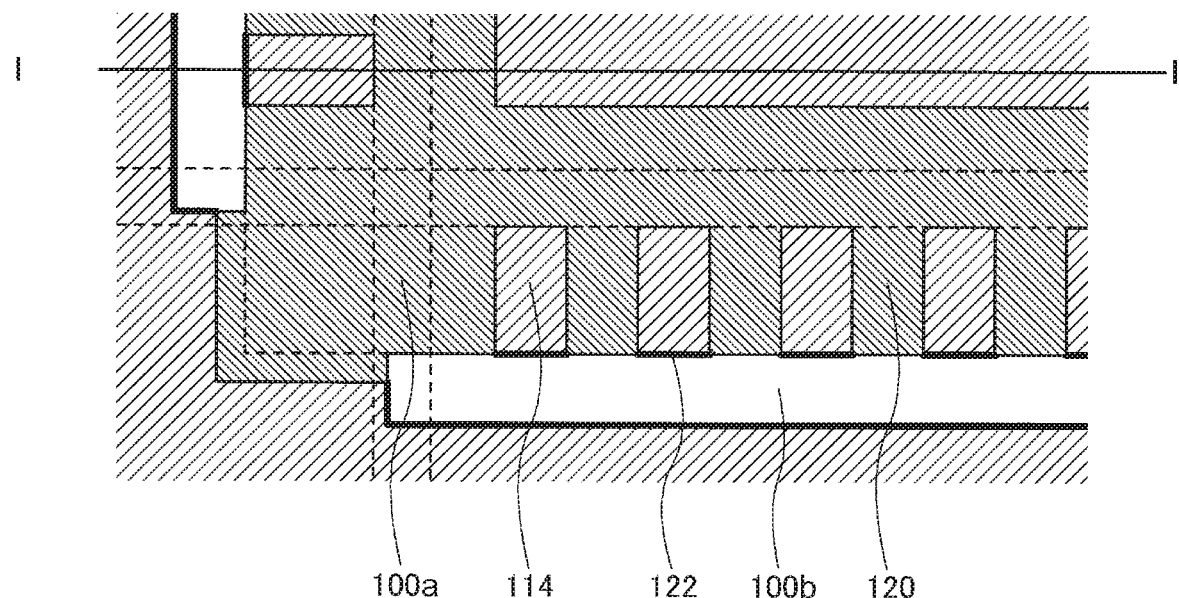
FIG. 5Q is an enlarged bottom view showing the step of the method for manufacturing the semiconductor package in the embodiment according to the present invention.
Figure 5R:
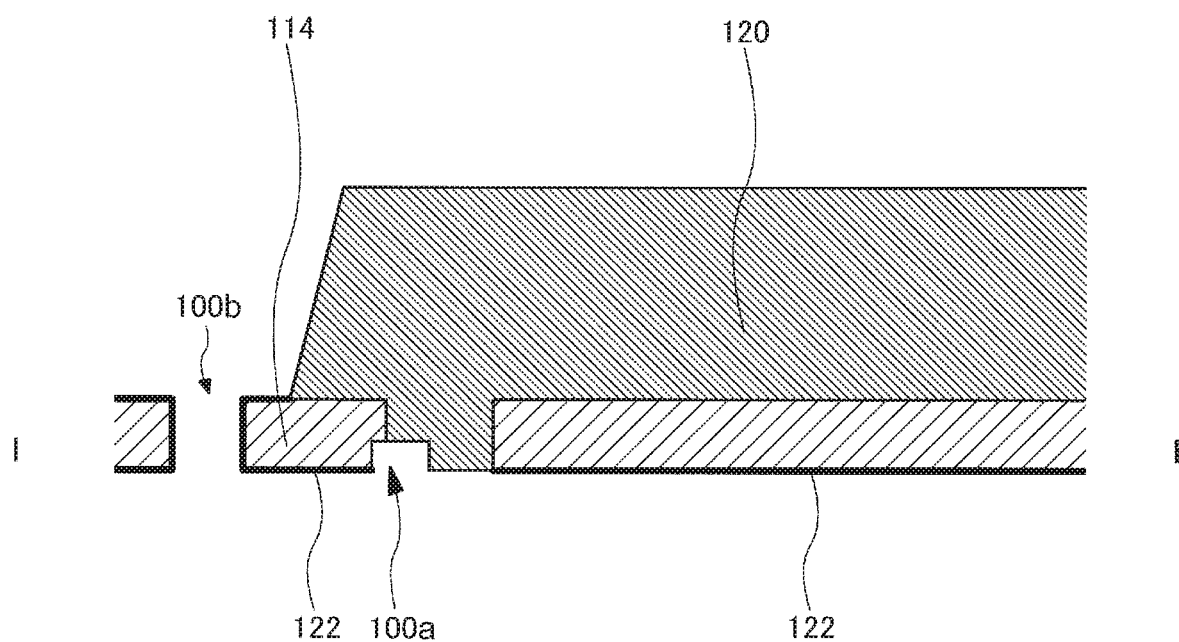
FIG. 5R is an enlarged cross-sectional view showing the step of the method for manufacturing the semiconductor package in the embodiment according to the present invention.

Next, the sealing member 120 covering the die pad 104, the plurality of external connection terminals 114 and the semiconductor chip 116 is formed (FIG. 5E and FIG. 5F). The sealing member 120 exposes the outer terminals 114e of the plurality of external connection terminals 114.

In this embodiment, the sealing member 120 is formed to cover a part of the lead frame 102 on the side of the top surface 102a and exposes the bottom surface 102b. Namely, in each of the plurality of regions A, a part of the top surface 114a of each of the plurality of external connection terminals 114, a top surface of the first coupling portion 106, the bottom surface of the die pad 104, the bottom surface 114b of each of the external connection terminals 114, a bottom surface of the first coupling portion 106, and a bottom surface of the second coupling portion 108 are exposed.

The sealing member 120 is formed by use of a mold. The assembly shown in FIG. 5C and FIG. 5D is set in a mold, and a sealing material is pushed into the mold at a high pressure to fill the space in the mold with the sealing material to form the sealing member 120. The sealing member 120 may be formed of a thermosetting resin. An example of the usable thermosetting resin is an epoxy resin.

Next, a first opening 100b is formed (FIG. 5G, FIG. 5H, FIG. 5I and FIG. 5J). The first opening 100b runs through at least the lead frame 102 and removes coupling portions at which the plurality of external connection terminals 114 and the first coupling portion 106 are coupled with each other. This exposes the side surface 114c of the outer terminal 114e of each of the plurality of external connection terminals 114. A side wall of the first opening 100b has a shape corresponding to the shape of the side surface 114c of the outer terminal 114e of each of the plurality of external connection terminals 114. The first opening 100b may be formed by a die process. An example of the usable die process is press working performed by use of a die.

In this embodiment, the first opening 100b is groove-like and is formed at each of four positions of each of the plurality of regions A. Namely, the groove-like first opening 100b is formed along each of the four sides of each region A.

In this embodiment, the first opening 100b is rectangular. The first opening 100b is not limited to being rectangular. As described above, the shape of the side wall of the first opening 100b corresponds to the shape of the side surface 114c of the outer terminal 114e of each external connection terminal 114. Therefore, the shape of the first opening 100b may be selected in accordance with a desired shape of the side surface 114c of the outer terminal 114e of each external connection terminal 114. For example, the side surface 114c of the outer terminal 114e of each external connection terminal 114 may include a protruding portion or a curved portion.

Next, an electrolytic plating process is performed to supply an electric current to the lead frame 102. As a result, the plating layer 122 is formed on the exposed areas of the lead frame 102 (FIG. 5K, FIG. 5L, FIG. 5M and FIG. 5N).

A preferable material of the plating layer 122 is a metal material that improves the solder wettability and decreases the electric resistance between an external line such as, for example, a line of a printed circuit board on which the semiconductor package 100 is to be mounted and the external connection terminals 114. A specific example of the material for the plating layer 122 may be Sn (tin), or Sn containing a metal material such as Ag (silver), Cu (copper), Bi (bismuth) or the like.

In the previous step, the first opening 100b is formed to remove the coupling portions at which the plurality of external connection terminals 114 and the first coupling portion 106 are coupled with each other. However, the plurality of external connection terminals 114 are still coupled with the lead frame 102 via the second coupling portion 108. Therefore, the plurality of external connection terminals 114 are supplied with an electric current by the electrolytic plating, and the exposed areas are plated.

A part of the top surface 114a of each of the plurality of external connection terminals 114, the top surface of the first coupling portion 106, the bottom surface of the die pad 104, the side surface 114c of the outer terminal 114e of each of the plurality of external connection terminals 114, the bottom surface 114b of each of the plurality of external connection terminals 114, the bottom surface of the first coupling portion 106, and the bottom surface of the second coupling portion 108 are exposed. The plating layer 122 is provided on these areas. Since the first opening 100b is formed, the plating layer 122 is also provided on the side surface 114c of the outer terminal 114e of each of the plurality of external connection terminals 114.

The conventional method for manufacturing a semiconductor package does not include the step of forming a first opening as is formed in this embodiment. Therefore, the side surface of the outer terminal of each of the plurality of external connection terminals is not plated.

Next, the grooves 100a are formed that separate the plurality of external connection terminals 114 and the second coupling portion 108 from the bottom surface 102b of the lead frame 102 (FIG. 5O, FIG. 5P, FIG. 5Q and FIG. 5R). The grooves 100a each have a bottom surface and do not run through the lead frame 102. It is sufficient that the grooves 100a have a depth enough to run through the thinned second coupling portion 108. The formation of the grooves 100a separates the plurality of external connection terminals 114 from each other.

The grooves 100a may be formed by a cutting process. An example of the usable cutting process is a cutting process performed by use of a dicing saw. With the cutting process by use of a dicing saw, a circular dicing blade formed of diamond is rotated at high speed to perform cutting while the circular dicing blade is cooled with, and the chips generated as a result of the cutting are washed away with, pure water.

In this embodiment, the grooves 100a are formed at four positions along four sides of a bottom surface of the semiconductor package 100. Also in this embodiment, the second coupling portion 108 is completely removed by the cutting process. This cutting process merely needs to separate the plurality of external connection terminals 114 from each other, and does not need to completely remove the second coupling portion 108.

Next, the plurality of semiconductor packages 100 are separated from each other by a die process. As a result of the above-described steps, the semiconductor package 100 in this embodiment shown in FIG. 1A through FIG. 4B is provided.

So far, the method for manufacturing the semiconductor package 100 in this embodiment has been described. The method for manufacturing the semiconductor package 100 in this embodiment allows the plating layer 122 to be formed on the side surface 114c of the outer terminal 114e of each external connection terminal 114. Therefore, the semiconductor package 100 has improved solder wettability at the side surface 114c of the outer terminal 114e of each of the plurality of external connection terminals 114.

Embodiment 2

[Structure of Semiconductor Package 200]

A semiconductor package 200 in this embodiment will be described with reference to the drawings.

Figure 6A:
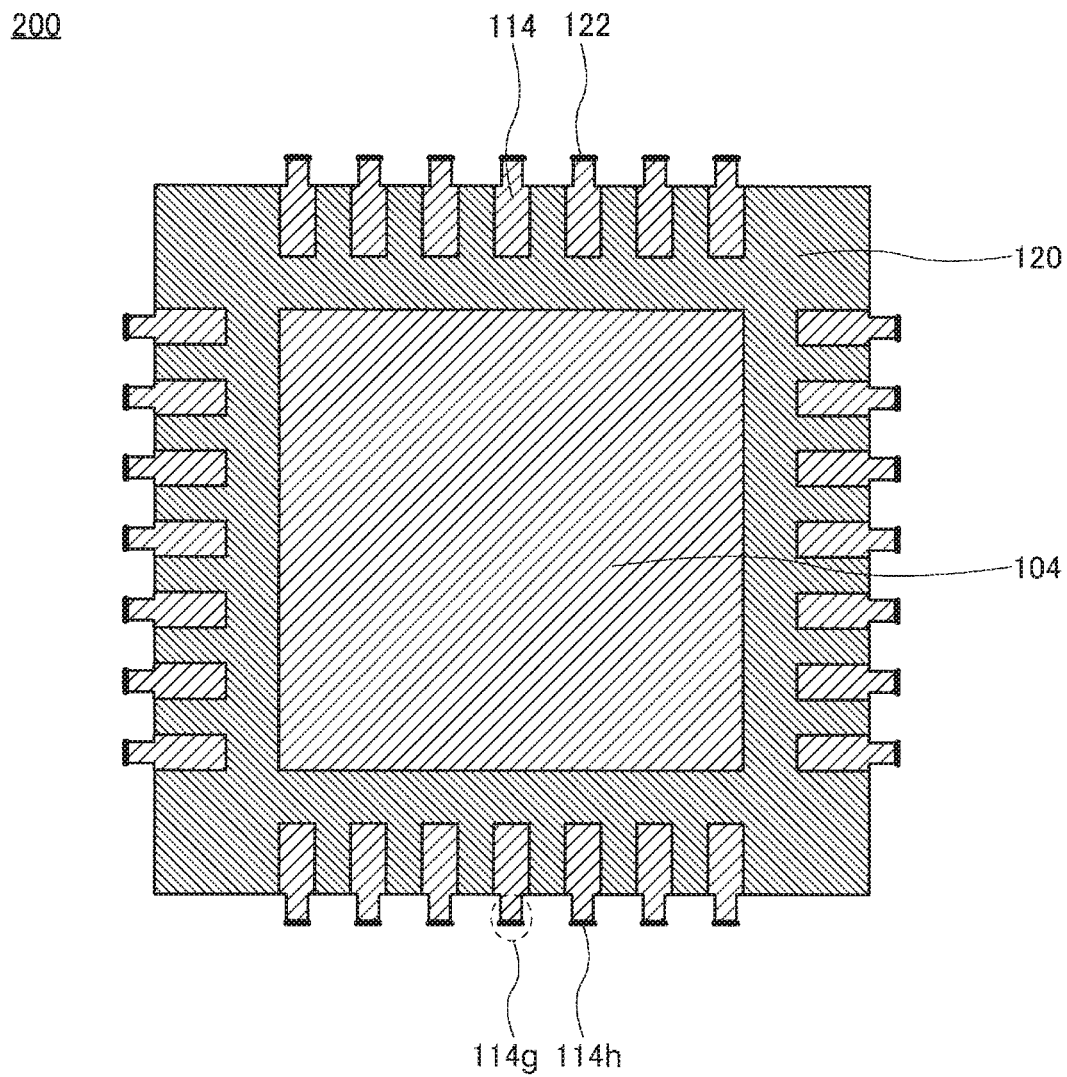
FIG. 6A is a bottom view showing a structure of a semiconductor package in an embodiment according to the present invention.
Figure 6B:
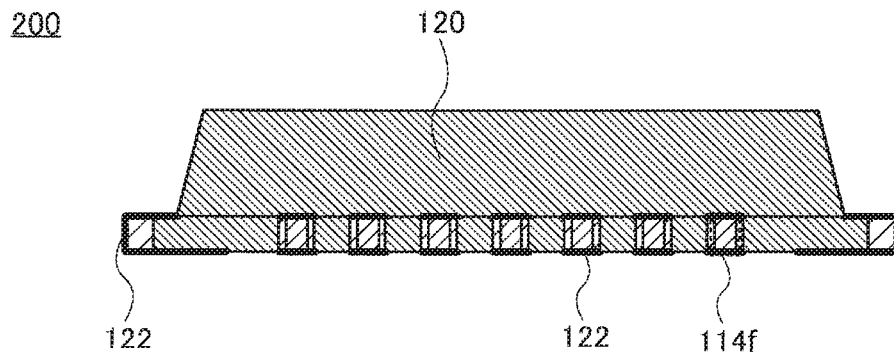
FIG. 6B is a side view showing the structure of the semiconductor package in the embodiment according to the present invention.
Figure 7A:
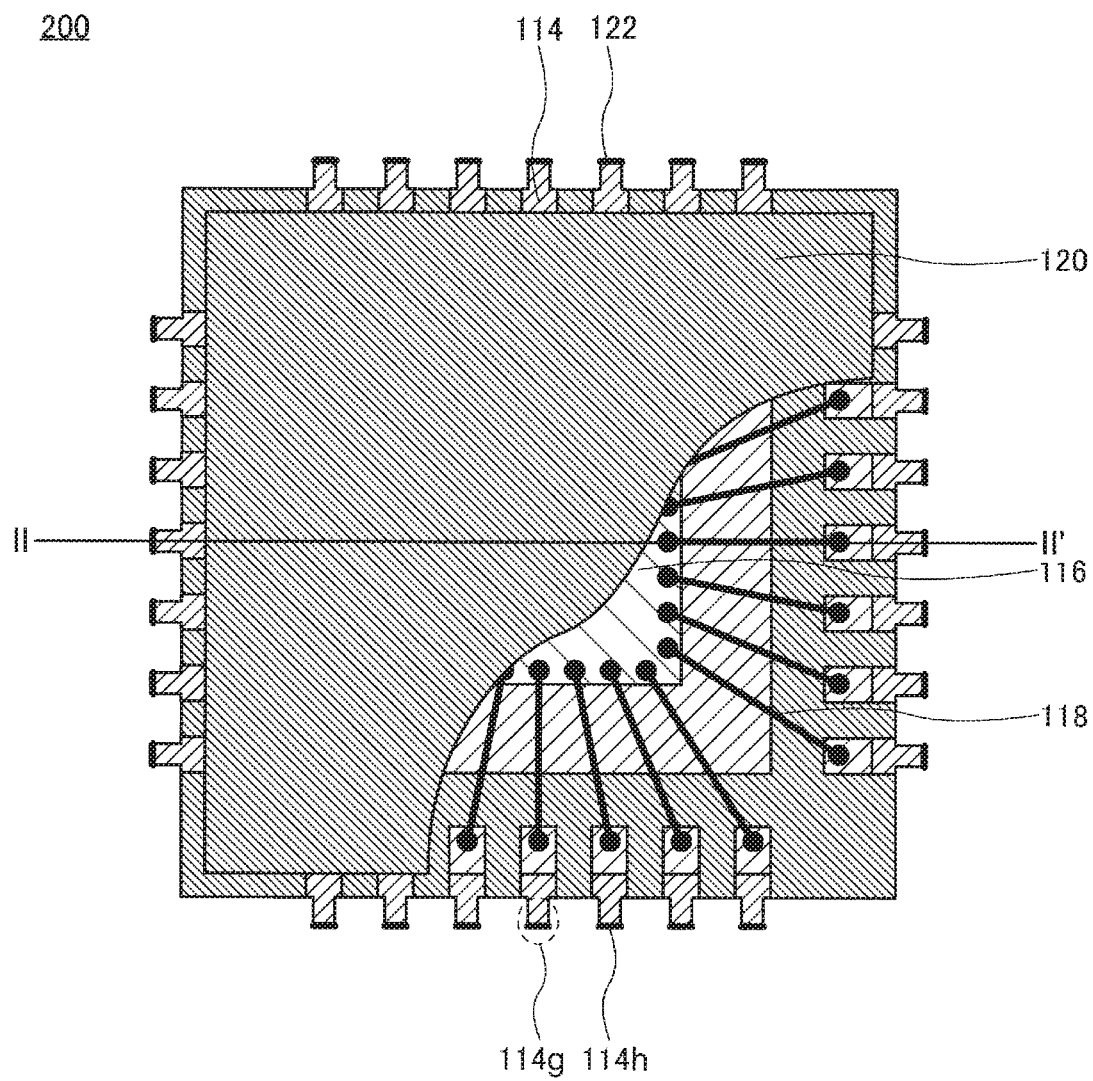
FIG. 7A is a plan view showing the structure of the semiconductor package in the embodiment according to the present invention.
Figure 7B:
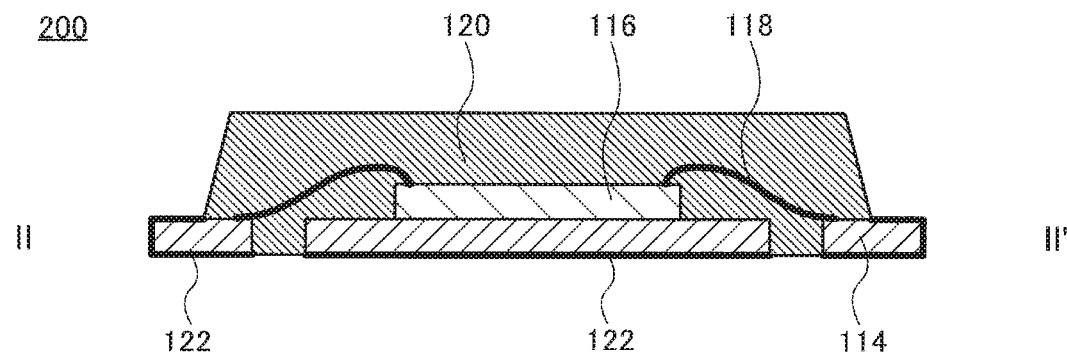
FIG. 7B is a cross-sectional view showing the structure of the semiconductor package in the embodiment according to the present invention.
Figure 8A:
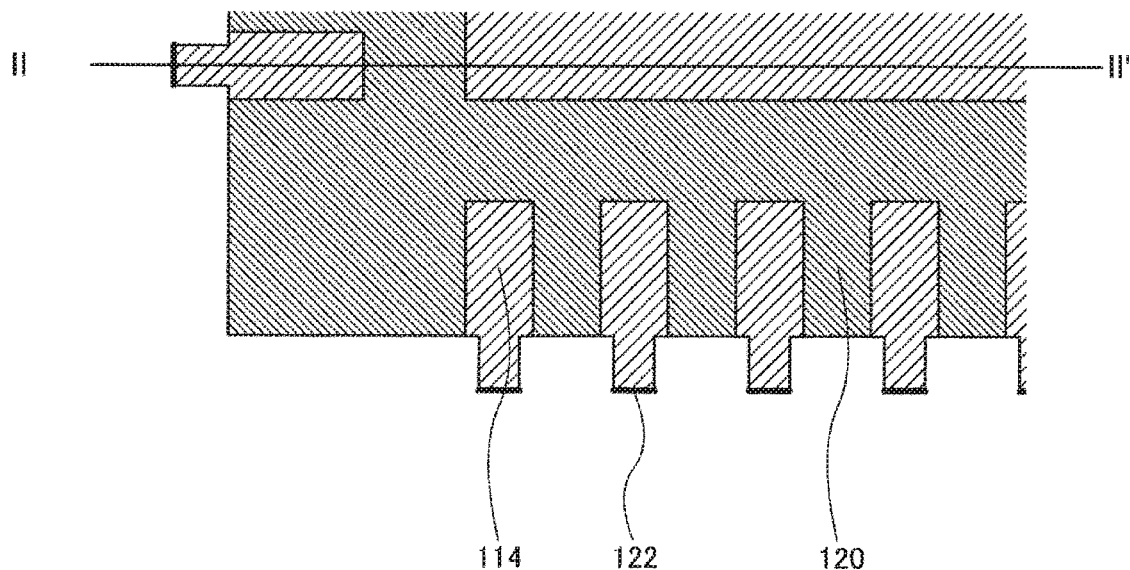
FIG. 8A is an enlarged bottom view showing the structure of the semiconductor package in the embodiment according to the present invention.
Figure 8B:
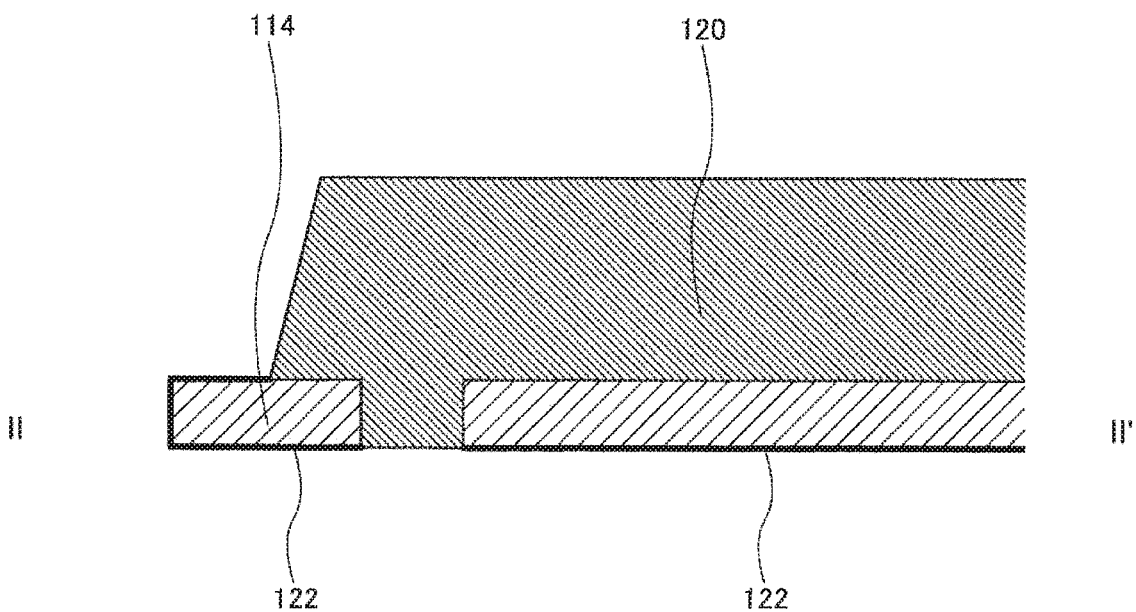
FIG. 8B is an enlarged cross-sectional view showing the structure of the semiconductor package in the embodiment according to the present invention.
Figure 14A:
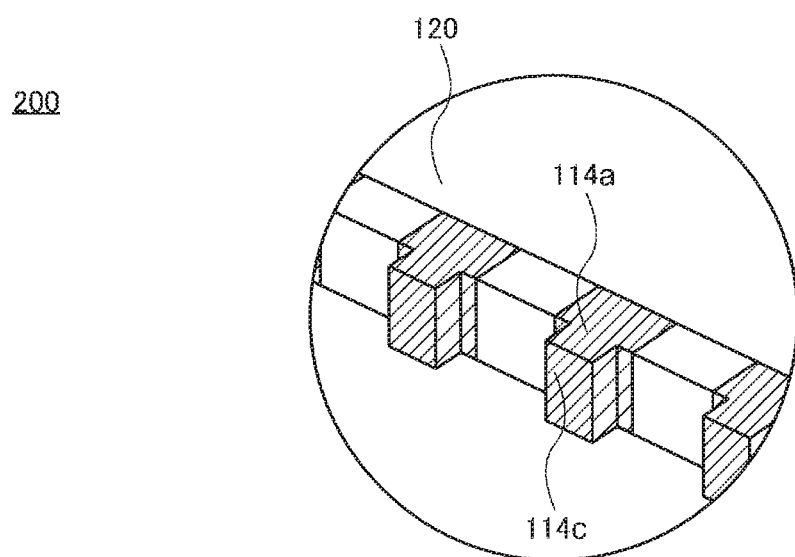
FIG. 14A is an enlarged perspective view showing the structure of the semiconductor package in one of the embodiments according to the present invention.
Figure 14B:
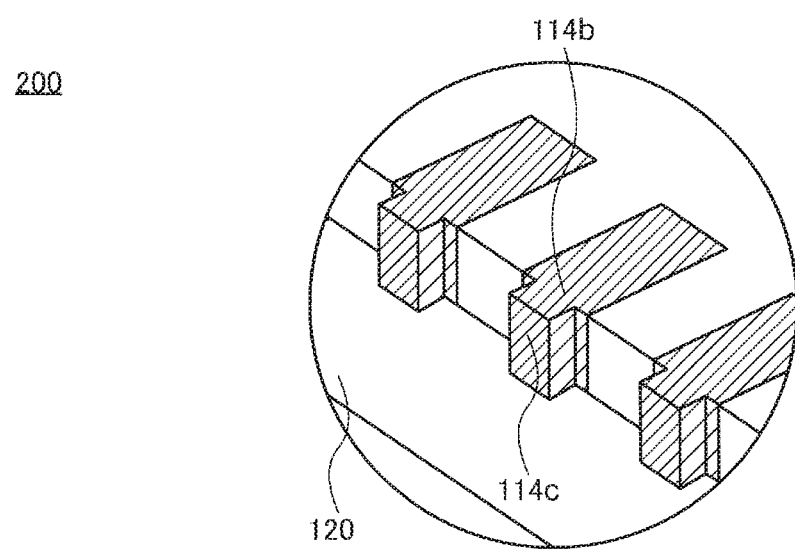
FIG. 14B is an enlarged perspective view showing the structure of the semiconductor package in one of the embodiments according to the present invention.

FIG. 14A and FIG. 14B are partial enlarged perspective views showing a structure of the semiconductor package 200 in this embodiment. FIG. 14A and FIG. 14B respectively show a top surface and a bottom surface of the semiconductor package 200, and each show the external connection terminals 114 and the vicinity thereof. FIG. 6A and FIG. 6B are respectively a bottom view and a side view showing the structure of the semiconductor package 200 in this embodiment. FIG. 7A and FIG. 7B are respectively a plan view and a cross-sectional view showing the structure of the semiconductor package 200 in this embodiment. FIG. 8A and FIG. 8B are respectively an enlarged bottom view and an enlarged cross-sectional view showing the structure of the semiconductor package 200 in this embodiment. FIG. 7A shows the semiconductor package 200 with a part of the sealing member 120 being cut off in order to show the semiconductor chip 116 and the like sealed therein. FIG. 7B and FIG. 8B are taken along line II-II' in FIG. 7A and FIG. 8A respectively.

In the following, descriptions of the components common to the semiconductor package 100 in embodiment 1 will be omitted and differences from embodiment 1 will be mainly described.

The semiconductor package 200 in this embodiment is different from the semiconductor package 100 in embodiment 1 on the structure of the external connection terminals 114. Specifically, as shown in, for example, FIG. 6A, FIG. 6B, FIG. 7A and FIG. 7B, in the semiconductor package 200 in this embodiment, the plurality of external connection terminals 114 each include a protruding portion 114g at the side surface 114c of the outer terminal 114d. The protruding portion 114g protrudes outer to a mold line 120a defining an area where the sealing member 120 is provided. A top surface and a bottom surface of the protruding portion 114g are on flat planes respectively parallel to the top surface and the bottom surface of the corresponding external connection terminal 114. The first region 114f where the plating layer 122 is to be provided includes an apex portion 114h of the protruding portion 114g. In this embodiment, the first region 114f corresponds to the apex portion 114h of the protruding portion 114g.

Regarding each external connection terminal 114 in the semiconductor package 200 in this embodiment, the plating layer 122 is provided on the bottom surface 114b and also the side surface 114c of the outer terminal 114e, which are both exposed. Such a structure improves the solder wettability at the side surface 114c of the outer terminal 114e of each external connection terminal 114. Thus, when the semiconductor package 200 is mounted on a printed circuit board or the like by solder, a good fillet is formed.

[Method for Manufacturing the Semiconductor Package 200]

A method for manufacturing the semiconductor package 200 in this embodiment will be described in detail with reference to the drawings. FIG. 9A through FIG. 9J show the method for manufacturing the semiconductor package 200 in this embodiment. FIG. 9A, FIG. 9C, FIG. 9E and FIG. 9G are plan views showing steps of the method for manufacturing the semiconductor package 200 in this embodiment. FIG. 9B, FIG. 9D, FIG. 8F and FIG. 9H are cross-sectional views showing the steps of the method for manufacturing the semiconductor package 200 in this embodiment, respectively corresponding to FIG. 9A, FIG. 9C, FIG. 9E and FIG. 9G. FIG. 5I is an enlarged bottom view in the step shown in FIG. 9G and FIG. 9H. FIG. 9J is an enlarged cross-sectional view in the step shown in FIG. 9G and FIG. 9H. FIG. 9B, FIG. 9D, FIG. 9F, FIG. 9H and FIG. 9J are taken along line II-II' in FIG. 9A, FIG. 9C, FIG. 9E, FIG. 9G and FIG. 9I respectively.

First, a structure of a lead frame 202 used to manufacture the semiconductor package 200 in this embodiment will be described in detail.

Figure 9A:
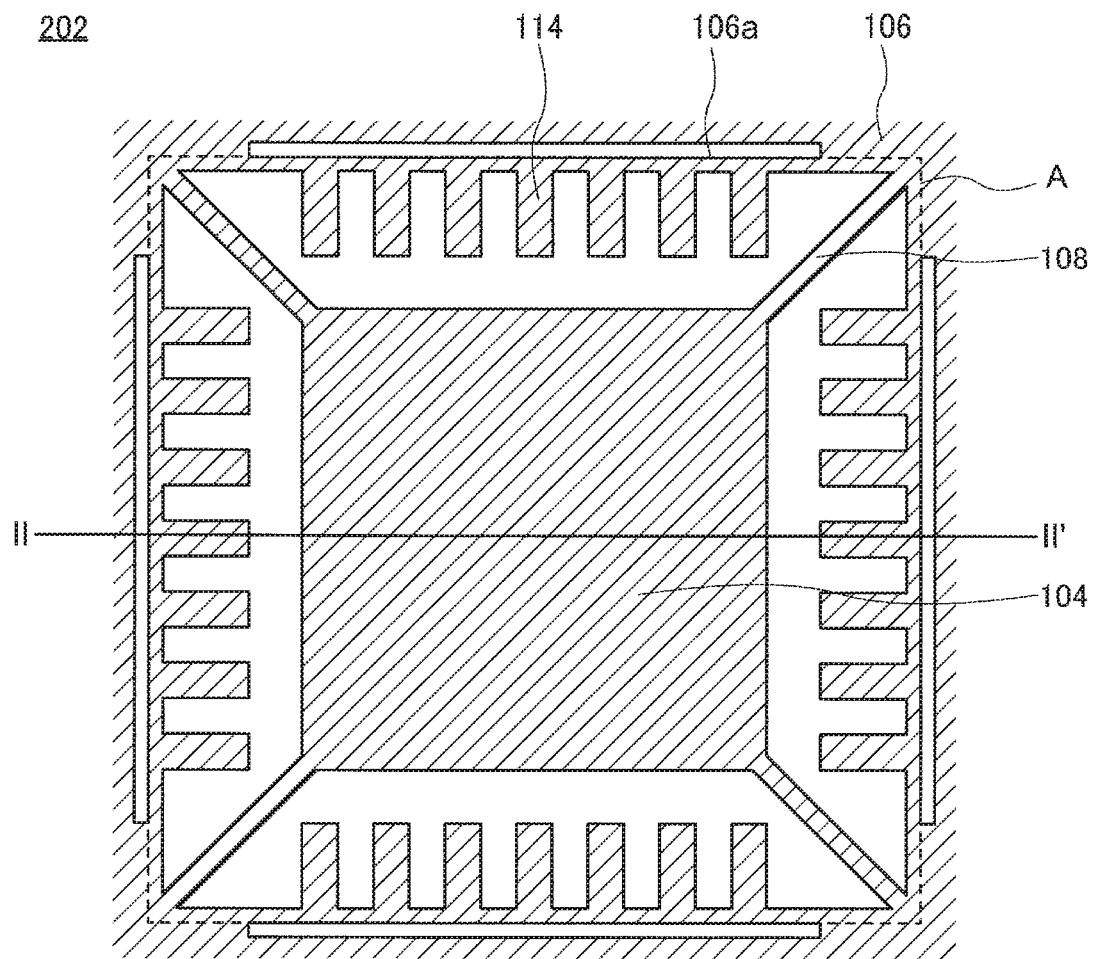
FIG. 9A is a plan view showing a step of a method for manufacturing the semiconductor package in the embodiment according to the present invention.
Figure 9B:
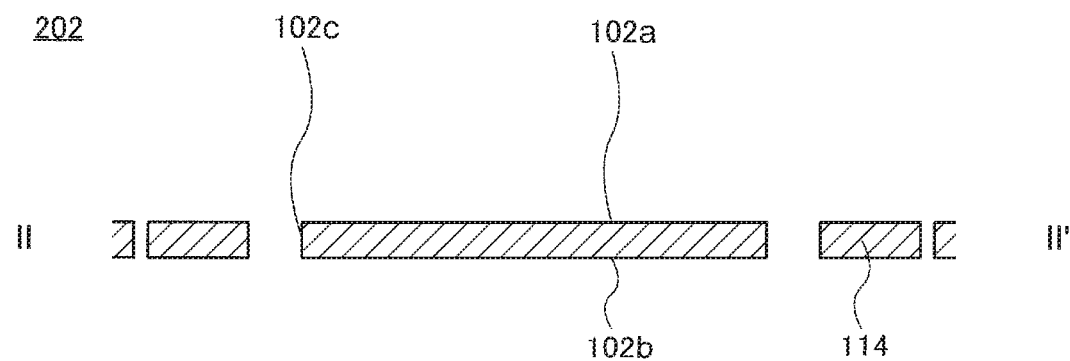
FIG. 9B is a cross-sectional view showing the step of the method for manufacturing the semiconductor package in the embodiment according to the present invention.

FIG. 9A and FIG. 9B are respectively a plan view and a cross-sectional view of the lead frame 202 used to manufacture the semiconductor package 200 in this embodiment. The lead frame 202 is formed of a metal plate, and includes a plurality of regions A (only one is shown in FIG. 9A and FIG. 9B). The lead frame 102 is to be divided into the plurality of regions A, and each of the plurality of regions A is used to provide the semiconductor package 200.

The thickness and the material of the metal plate used to form the lead frame 202 are substantially the same as those described above in embodiment 1.

The metal plate may be subjected to a process including etching or punching performed by use of a die, to be formed into the lead frame 202 described below.

The plurality of regions A each include the die pad 104, the plurality of external connection terminals 114, and the first coupling portion 106.

The die pad 104 and the plurality of external connection terminals 114 have substantially the same structures as those described above in embodiment 1. Hereinafter, the differences in the structure of the first coupling portion 106 from embodiment 1 will be described.

In the lead frame 202 in this embodiment, the first coupling portion 106 has a first opening 106a, which is groove-like, formed along the outer terminals 114e of the plurality of external connection terminals 114. Also in this embodiment, the groove-like first openings 106a is formed at each of four positions of each of the plurality of areas A. Namely, the groove-like first opening 106a is formed along each of the four sides of each of the plurality of regions A.

It is preferable that the first openings 106a in the first coupling portion 106 are located such that side walls of the first openings 106a are as close as possible to the plurality of external connection terminals 114. From the point of view of keeping the strength of the coupling portion at which the first coupling portion 106 and the plurality of external connection terminals 114 are coupled with each other, it is preferable that the side walls of the first openings 106a have a sufficient distance from the plurality of external connection terminals 114.

The components of the lead frame 202 in this embodiment are coupled with each other physically and electrically.

So far, the structure of the lead frame 202 used to manufacture the semiconductor package 200 in this embodiment has been described. Now, the method for manufacturing the semiconductor package 200 in this embodiment will be described in detail.

First, the above-described lead frame 202 is prepared (FIG. 9A and FIG. 9B).

Figure 9C:
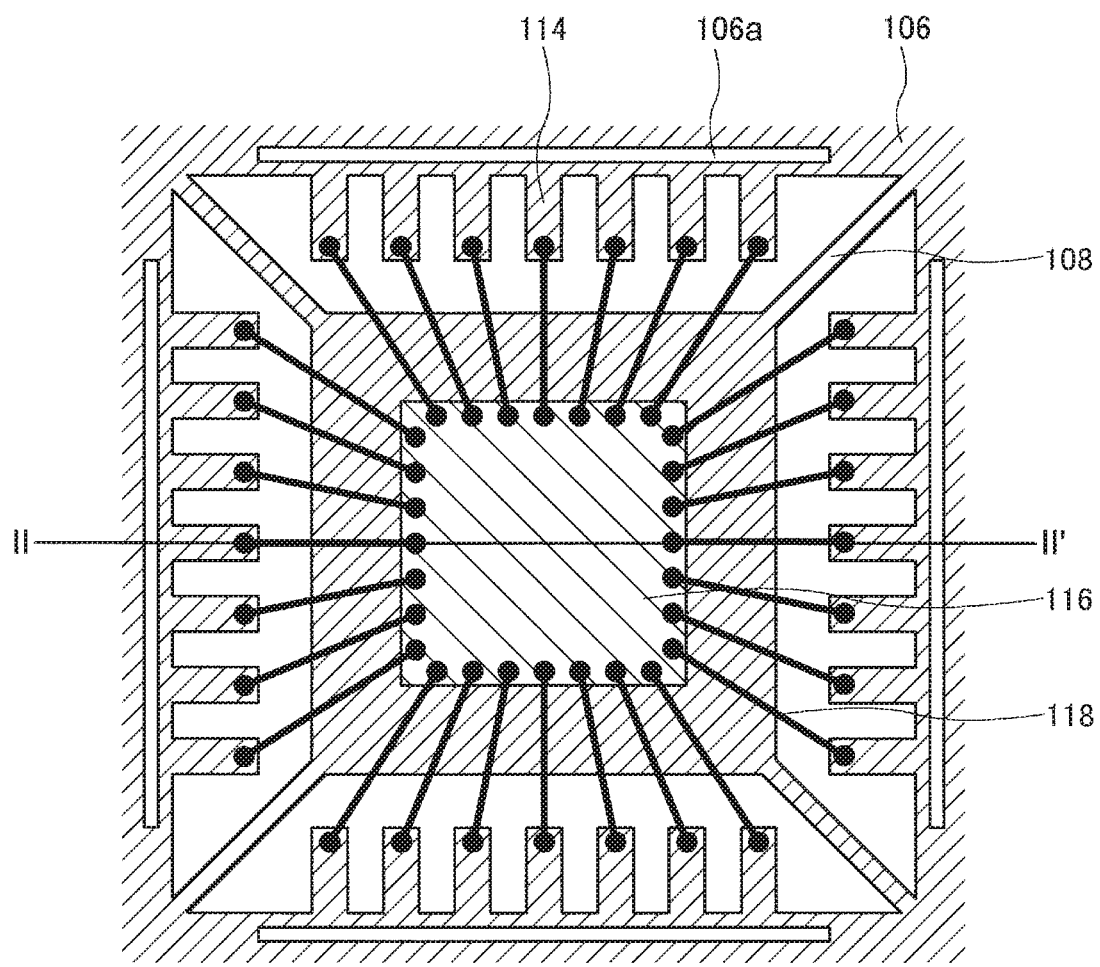
FIG. 9C is a plan view showing a step of the method for manufacturing the semiconductor package in the embodiment according to the present invention.
Figure 9D:
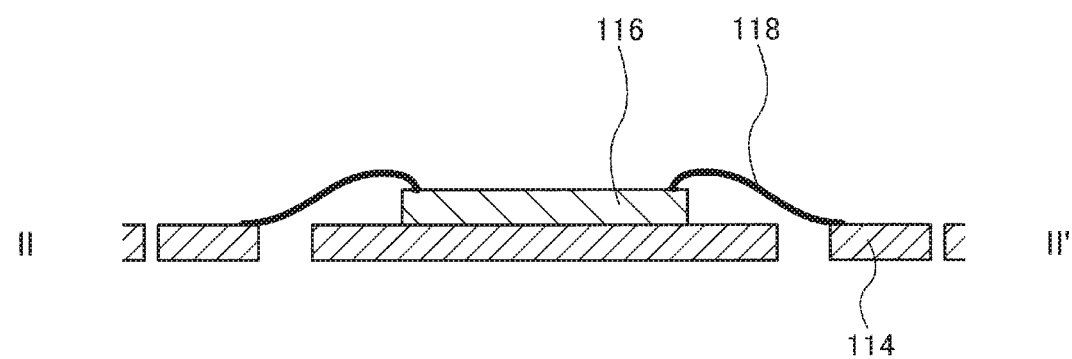
FIG. 9D is a cross-sectional view showing the step of the method for manufacturing the semiconductor package in the embodiment according to the present invention.

Next, the semiconductor chip 116 is located on the die pad 104 on a top surface 202a of the lead frame 202. The semiconductor chip 116 is electrically connected with the plurality of external connection terminals 114. In this embodiment, the semiconductor chip 116 and the plurality of external connection terminals 114 are connected with each other by the wires 118 respectively (FIG. 9C and FIG. 9D).

Figure 9E:
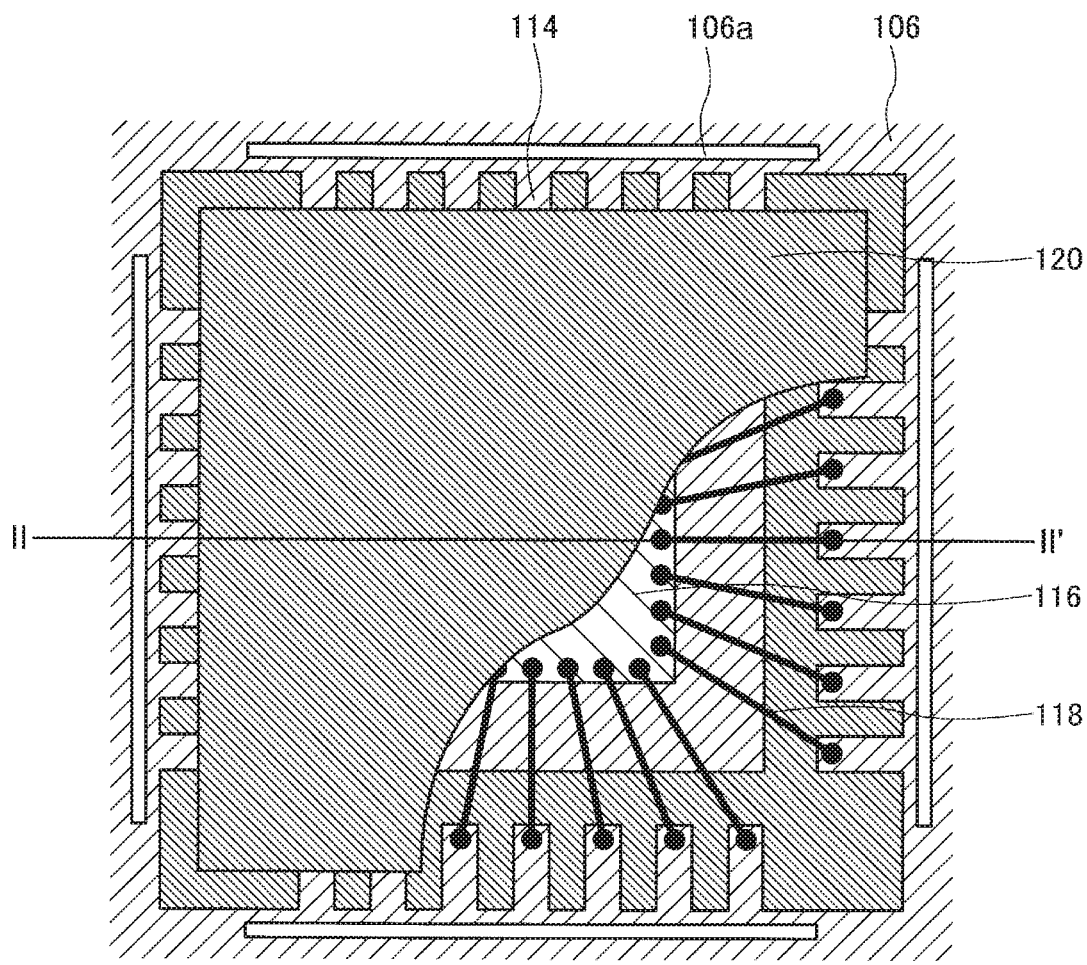
FIG. 9E is a plan view showing a step of the method for manufacturing the semiconductor package in the embodiment according to the present invention.
Figure 9F:
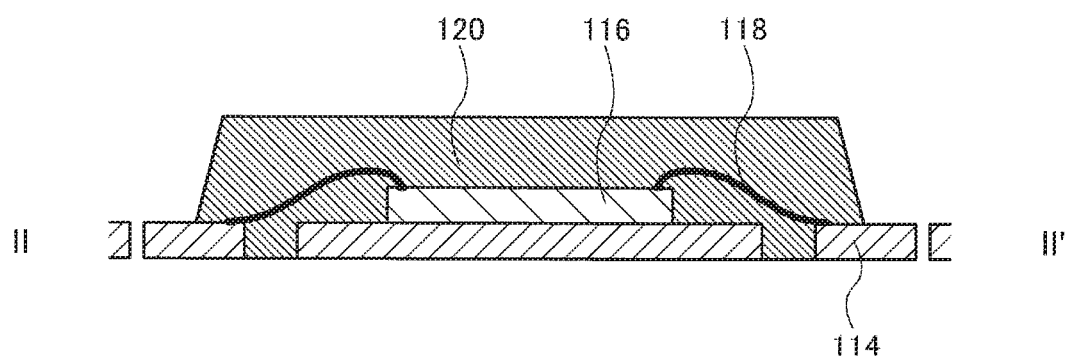
FIG. 9F is a cross-sectional view showing the step of the method for manufacturing the semiconductor package in the embodiment according to the present invention.
Figure 9G:
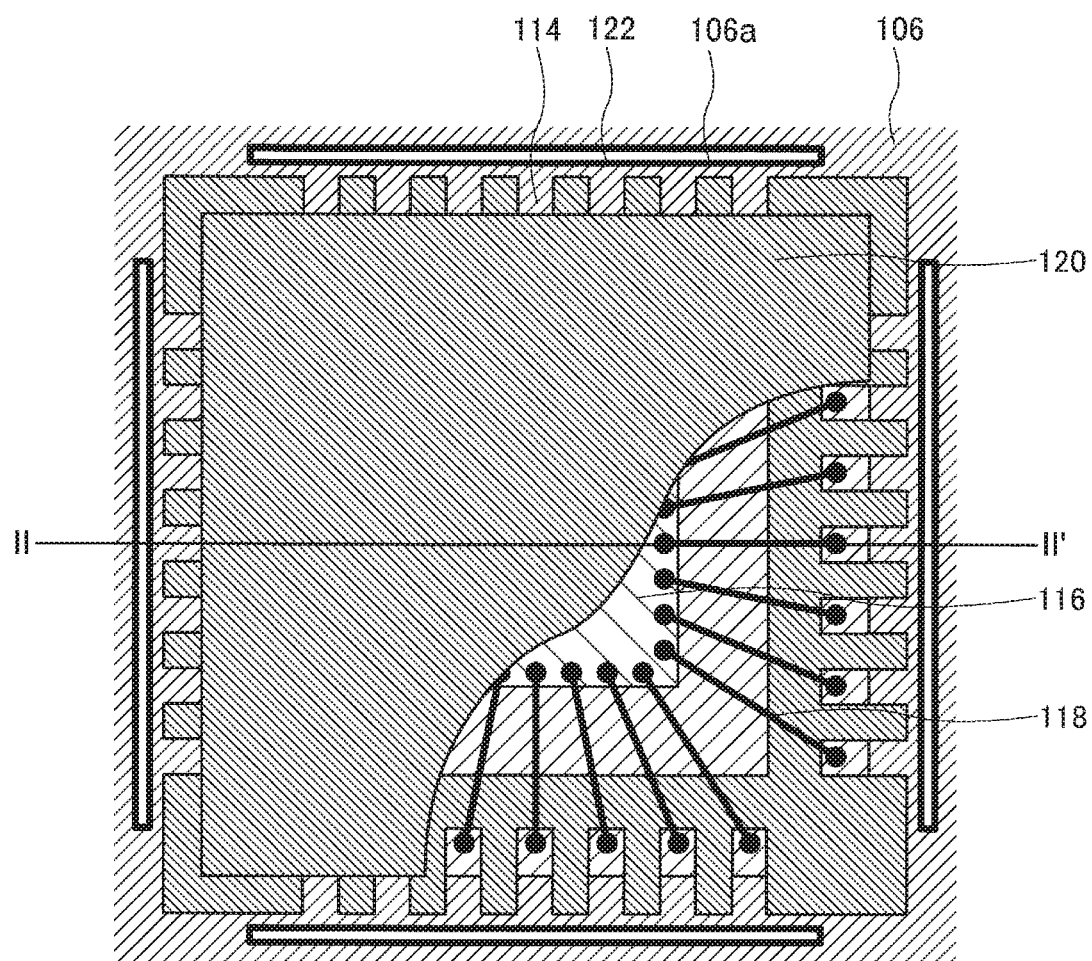
FIG. 9G a plan view showing a step of the method for manufacturing the semiconductor package in the embodiment according to the present invention.
Figure 9H:
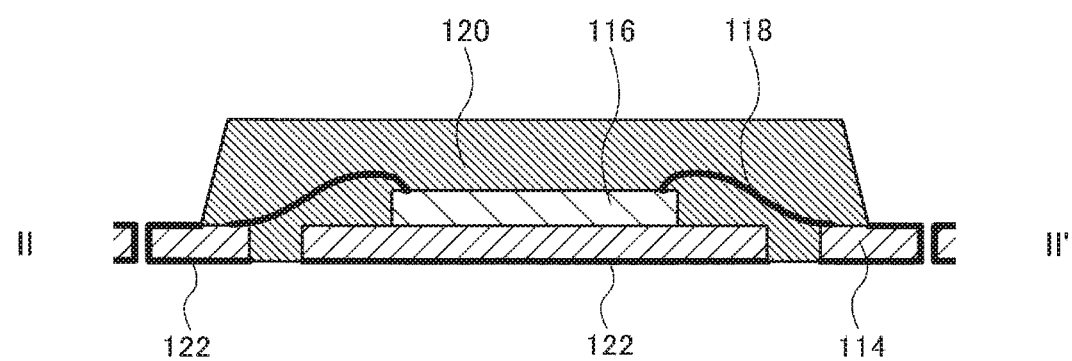
FIG. 9H is a cross-sectional view showing the step of the method for manufacturing the semiconductor package in the embodiment according to the present invention.
Figure 9I:
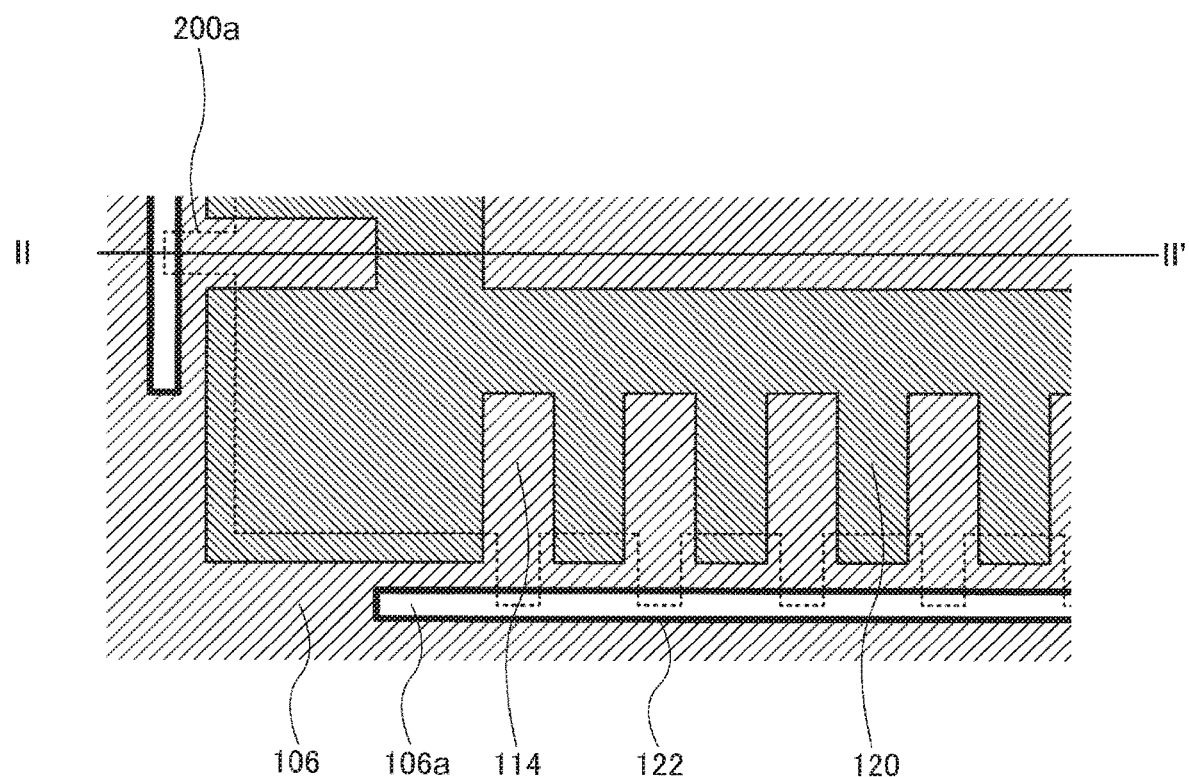
FIG. 9I is an enlarged bottom view showing the step of the method for manufacturing the semiconductor package in the embodiment according to the present invention.
Figure 9J:
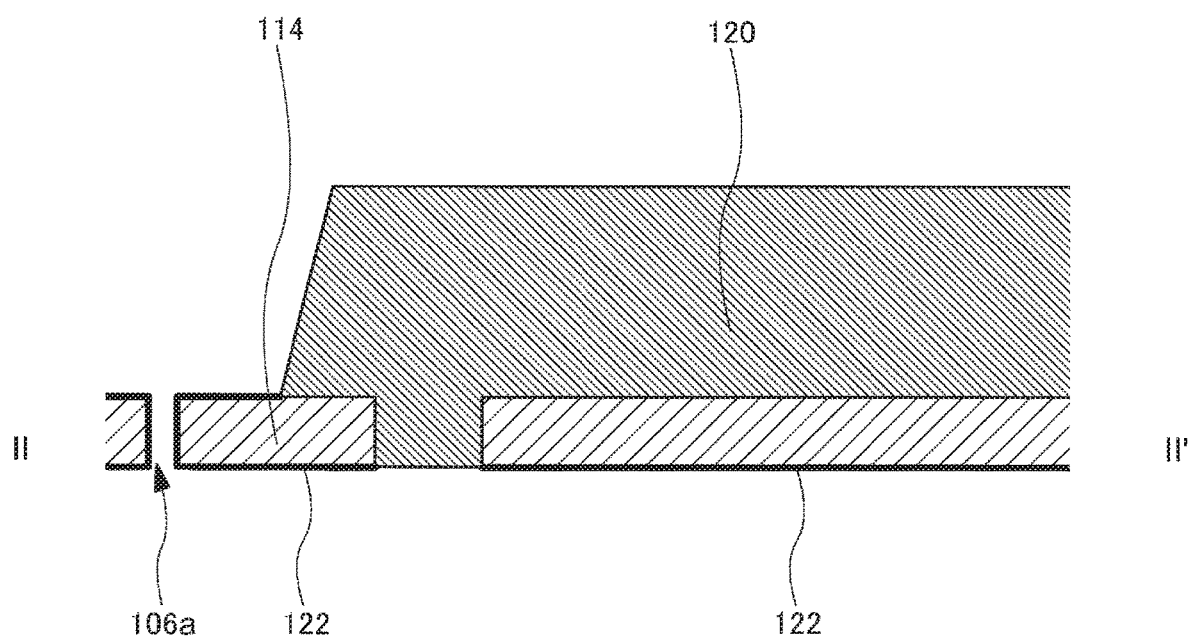
FIG. 9J is an enlarged cross-sectional view showing the step of the method for manufacturing the semiconductor package in the embodiment according to the present invention.

Next, the sealing member 120 covering the die pad 104, the plurality of external connection terminals 114 and the semiconductor chip 116 is formed (FIG. 9E and FIG. 9F). The sealing member 120 exposes the outer terminals 114e of the plurality of external connection terminals 114. The sealing member 120 is formed by a mold process.

Next, an electrolytic plating process is performed to supply an electric current to the lead frame 202 (FIG. 9G, FIG. 9H, FIG. 9I and FIG. 9J). As a result, the plating layer 122 is formed on the exposed areas of the lead frame 202.

Next, the plurality of semiconductor packages 200 are separated from each other by a die process. Concurrently, the plurality of external connection terminals 114 are separated from each other such that each of the plurality of external connection terminals 114 includes, in a side surface thereof, a part of the side wall of the first opening 106a. For separating the plurality of semiconductor packages 200 from each other by use of a die process, press working may be performed by use of a die having a predetermined pattern. The cutting is performed along a pattern 200a shown in FIG. 9I. The shape of the side wall of each first opening 106a corresponds to the shape of the side surface 114c of the outer terminal 114e of each of the plurality of external connection terminals 114. As a result of the above-described steps, the semiconductor package 200 in this embodiment shown in FIG. 6A through FIG. 8B is provided.

In this embodiment, the first opening 106a is rectangular. The first opening 106a is not limited to being rectangular. As described above, the shape of the side wall of the first opening 106a corresponds to the shape of the side surface 114c of the outer terminal 114e of each external connection terminal 114. Therefore, the shape of the first opening 106a may be selected in accordance with a desired shape of the side surface 114c of the outer terminal 114e of each external connection terminal 114. For example, the side surface 114c of the outer terminal 114e of each external connection terminal 114 may include a semi-elliptical or triangular protruding portion.

So far, the method for manufacturing the semiconductor package 200 in this embodiment has been described. The method for manufacturing the semiconductor package 200 in this embodiment allows the plating layer 122 to be provided on the exposed side surface 114c of the outer terminal 114e of each external connection terminal 114. Therefore, the semiconductor package 200 has improved solder wettability at the side surface 114c of the outer terminal 114e of each of the plurality of external connection terminals 114.

Embodiment 3

[Structure of Semiconductor Package 300]

A semiconductor package 300 in this embodiment will be described with reference to the drawings.

Figure 10A:
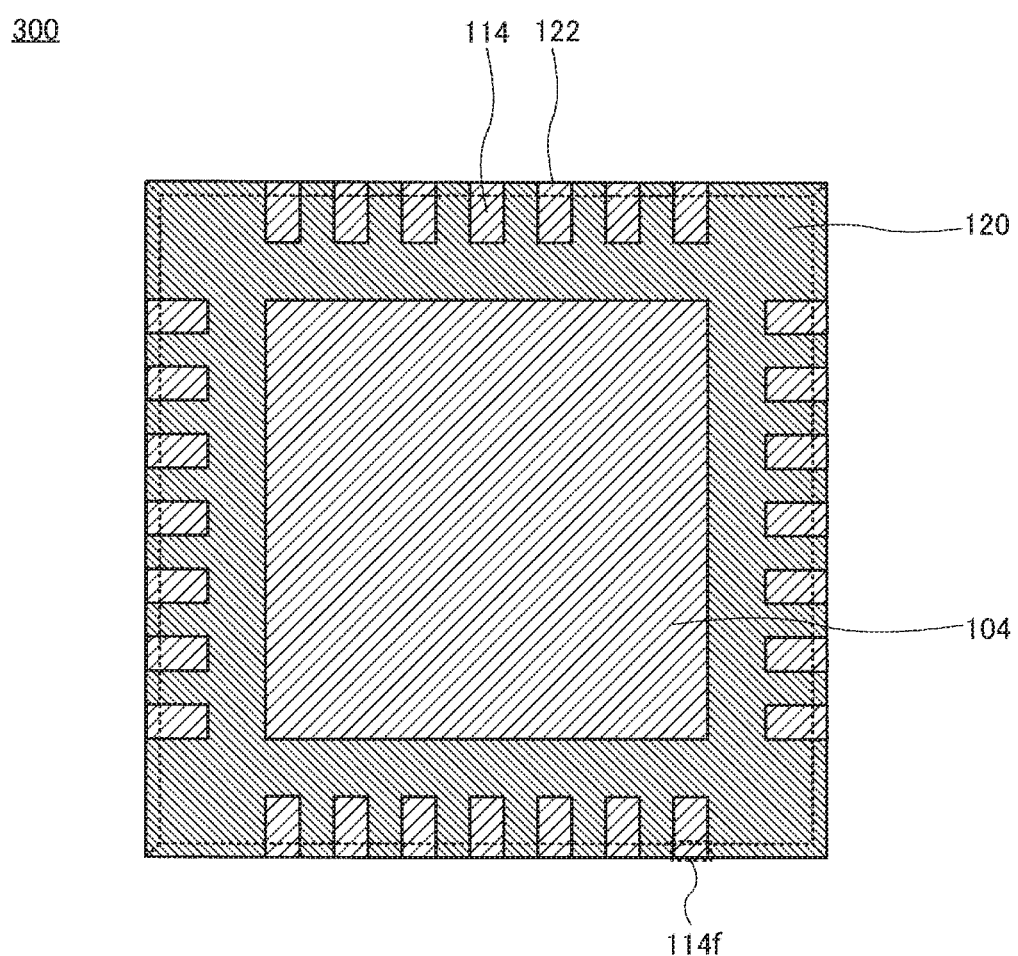
FIG. 10A is a bottom view showing a structure of a semiconductor package in an embodiment according to the present invention.
Figure 10B:
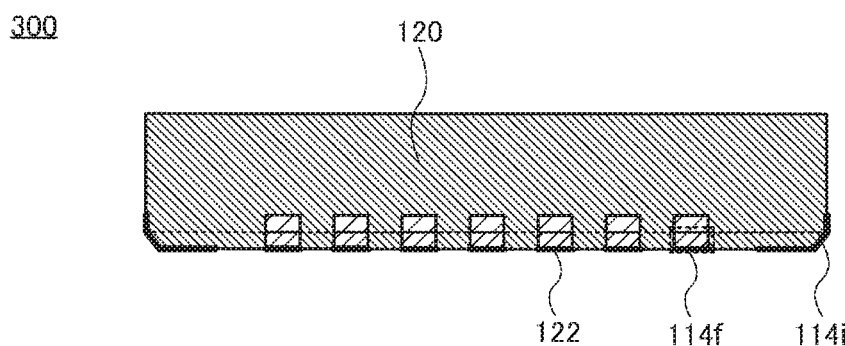
FIG. 10B is a side view showing the structure of the semiconductor package in the embodiment according to the present invention.
Figure 11A:
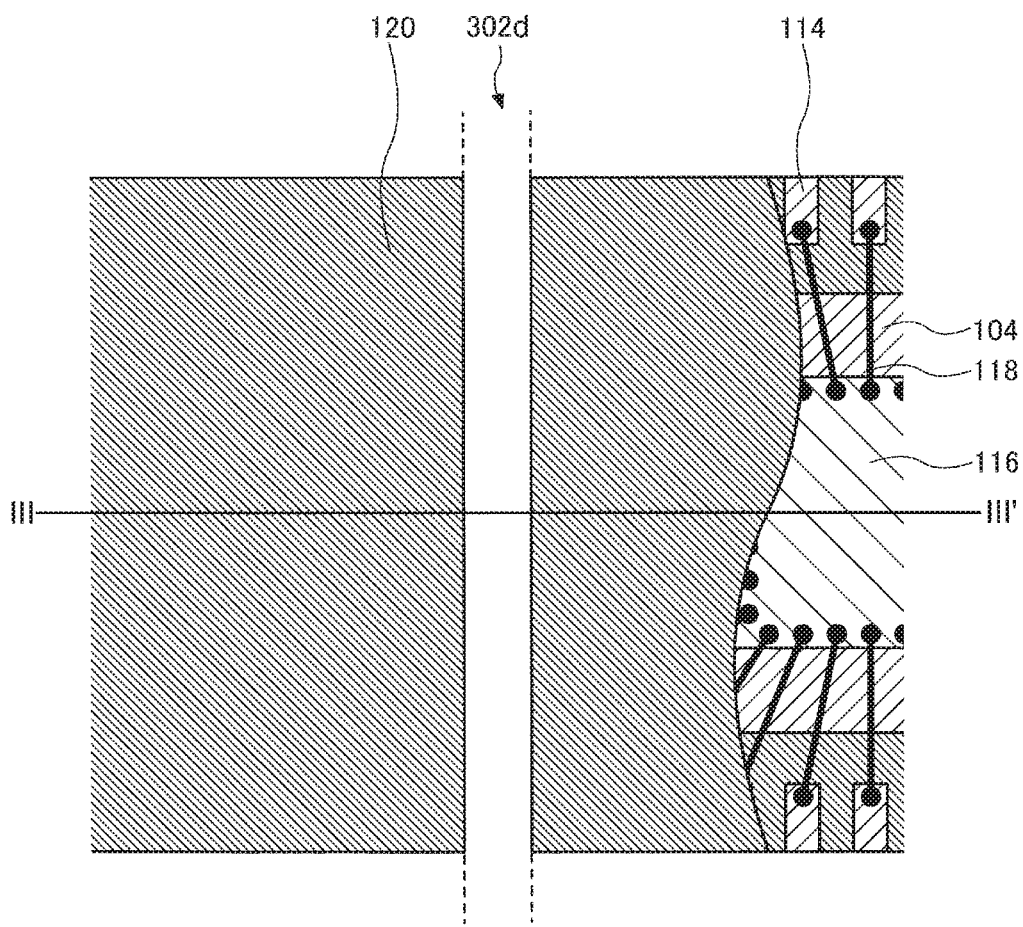
FIG. 11A is a plan view showing the structure of the semiconductor package in the embodiment according to the present invention.
Figure 11B:
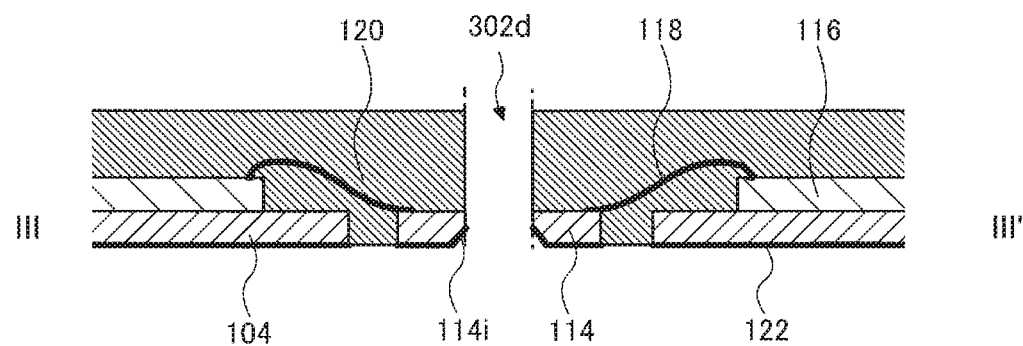
FIG. 11B is a cross-sectional view showing the structure of the semiconductor package in the embodiment according to the present invention.
Figure 15A:
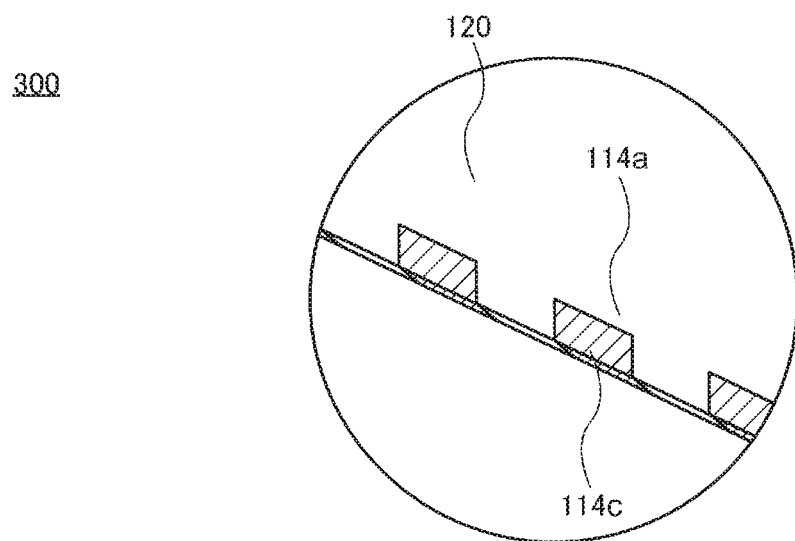
FIG. 15A is an enlarged perspective view showing the structure of the semiconductor package in one of the embodiments according to the present invention.
Figure 15B:
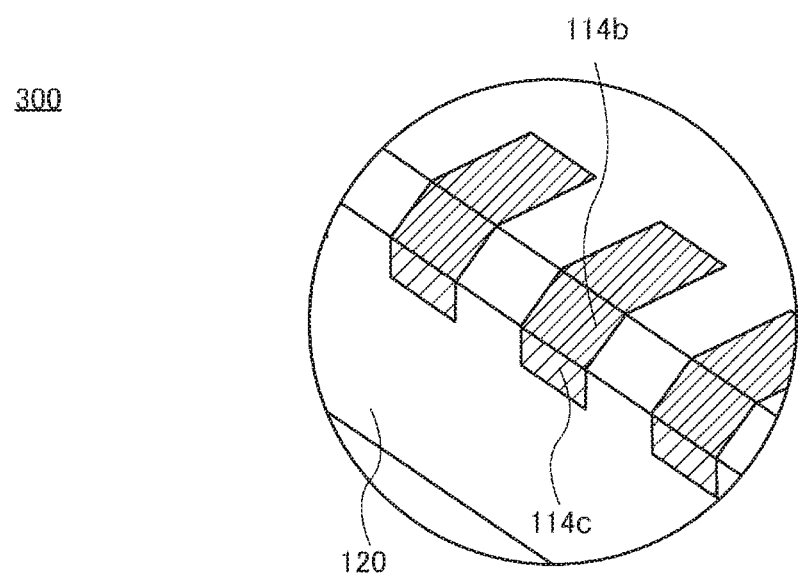
FIG. 15B is an enlarged perspective view showing the structure of the semiconductor package in one of the embodiments according to the present invention.

FIG. 15A and FIG. 15B are partial enlarged perspective views showing a structure of the semiconductor package 300 in this embodiment. FIG. 15A and FIG. 15B respectively show a top surface and a bottom surface of the semiconductor package 300, and each show the external connection terminals 114 and the vicinity thereof. FIG. 10A and FIG. 10B are respectively a bottom view and a side view showing the structure of the semiconductor package 300 in this embodiment. FIG. 11A and FIG. 11B are respectively a plan view and a cross-sectional view showing the structure of the semiconductor package 300 in this embodiment. FIG. 11A shows the semiconductor package 300 with a part of the sealing member 120 being cut off in order to show the semiconductor chip 116 and the like sealed therein. FIG. 11B is taken along line in FIG. 11A. In this embodiment, the structure of, and the method for manufacturing, the semiconductor package 300 of a batch molding system will be described as an example. This embodiment is also applicable to an individual molding system shown in embodiment 1 and embodiment 2.

In the following, descriptions of the components common to the semiconductor package 100 in embodiment 1 will be omitted and differences from embodiment 1 will be mainly described.

Unlike in the semiconductor package 100 in embodiment 1, in the semiconductor package 300 in this embodiment, the side surface 114c of the outer terminal 114e of each of the plurality of external connection terminals 114 includes a tapering portion 114i, and the first area 114f on which the plating layer 122 is to be provided includes the tapering portion 114i. In this embodiment, the first region 114f corresponds to the tapering portion 114i.

[Method for Manufacturing the Semiconductor Package 300]

A method for manufacturing the semiconductor package 300 in this embodiment will be described in detail with reference to the drawings. FIG. 12A through FIG. 12J show the method for manufacturing the semiconductor package 300 in this embodiment. FIG. 12A, FIG. 12C, FIG. 12E, FIG. 12G and FIG. 12I are plan views showing steps of the method for manufacturing the semiconductor package 300 in this embodiment. FIG. 12B, FIG. 12D, FIG. 12F, FIG. 12H and FIG. 12J are cross-sectional views showing the steps of the method for manufacturing the semiconductor package 300 in this embodiment, respectively corresponding to FIG. 12A, FIG. 12C, FIG. 12E, FIG. 12G and FIG. 12I. FIG. 12B, FIG. 12D, FIG. 12F, FIG. 12H and FIG. 12J are taken along line in FIG. 12A, FIG. 12C, FIG. 12E, FIG. 12G and FIG. 12I respectively.

First, a structure of a lead frame 302 used to manufacture the semiconductor package 300 in this embodiment will be described in detail.

Figure 12A:
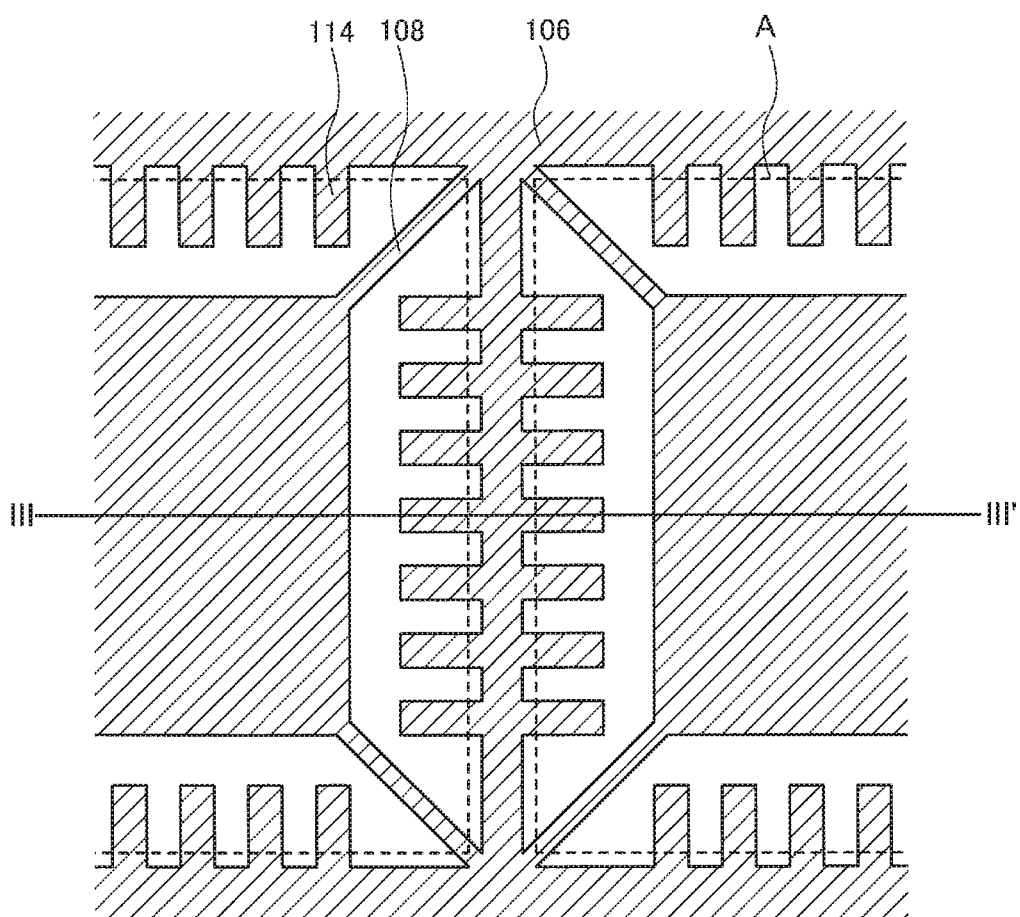
FIG. 12A is a plan view showing a step of a method for manufacturing the semiconductor package in the embodiment according to the present invention.
Figure 12B:
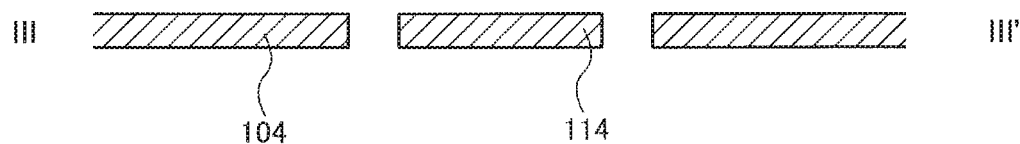
FIG. 12B is a cross-sectional view showing the step of the method for manufacturing the semiconductor package in the embodiment according to the present invention.

FIG. 12A and FIG. 12B are respectively a plan view and a cross-sectional view of the lead frame 302 used to manufacture the semiconductor package 300 in this embodiment. The lead frame 302 is formed of a metal plate, and includes a plurality of regions A demarcated by a dicing line 302d (FIG. 11A and FIG. 11B) (only one is shown in FIG. 9A and FIG. 9B). The lead frame 302 is to be divided into the plurality of regions A, and each of the plurality of regions A is used to provide the semiconductor package 300.

The thickness and the material of the metal plate used to form the lead frame 302 are substantially the same as those described above in embodiment 1.

The metal plate may be subjected to a process including etching or punching performed by use of a die to be formed into the lead frame 302 described below.

The plurality of regions A each include the die pad 104, the plurality of external connection terminals 114, and the first coupling portion 106.

The die pad 104, the plurality of external connection terminals 114 and the first coupling portion 106 have substantially the same structures as those described above in embodiment 1, and thus will not be described in detail.

The components of the lead frame 302 in this embodiment are coupled with each other physically and electrically.

So far, the structure of the lead frame 302 used to manufacture the semiconductor package 300 in this embodiment has been described. Now, the method for manufacturing the semiconductor package 300 in this embodiment will be described in detail.

First, the above-described lead frame 302 is prepared (FIG. 12A and FIG. 12B).

Figure 12C:
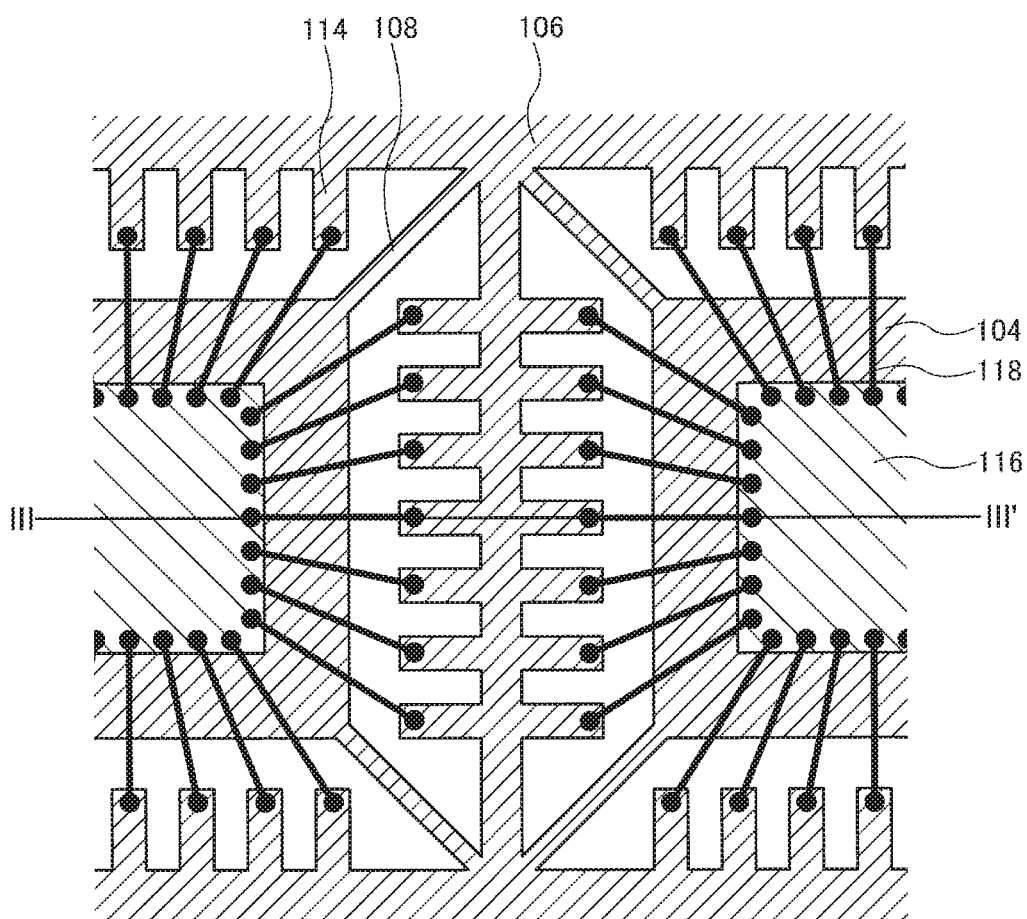
FIG. 12C is a plan view showing a step of the method for manufacturing the semiconductor package in the embodiment according to the present invention.
Figure 12D:
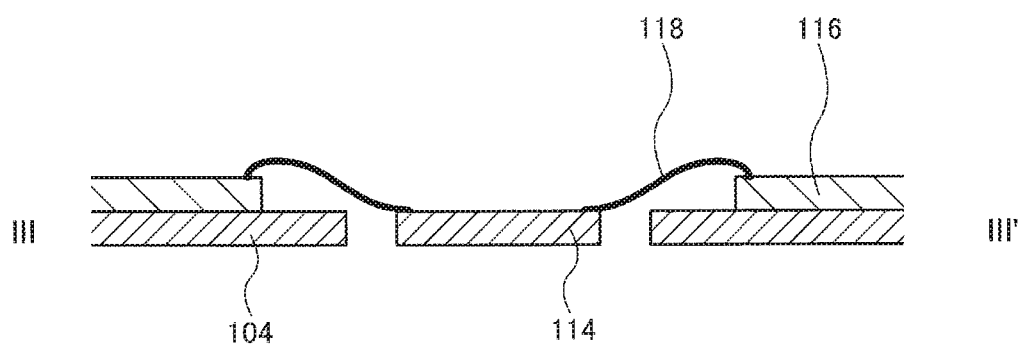
FIG. 12D is a cross-sectional view showing the step of the method for manufacturing the semiconductor package in the embodiment according to the present invention.

Next, the semiconductor chip 116 is located on the die pad 104 on a top surface 302a of the lead frame 302. The semiconductor chip 116 is electrically connected with the plurality of external connection terminals 114. In this embodiment, the semiconductor chip 116 and the plurality of external connection terminals 114 are connected with each other by the wires 118 respectively (FIG. 12C and FIG. 12D).

Figure 12E:
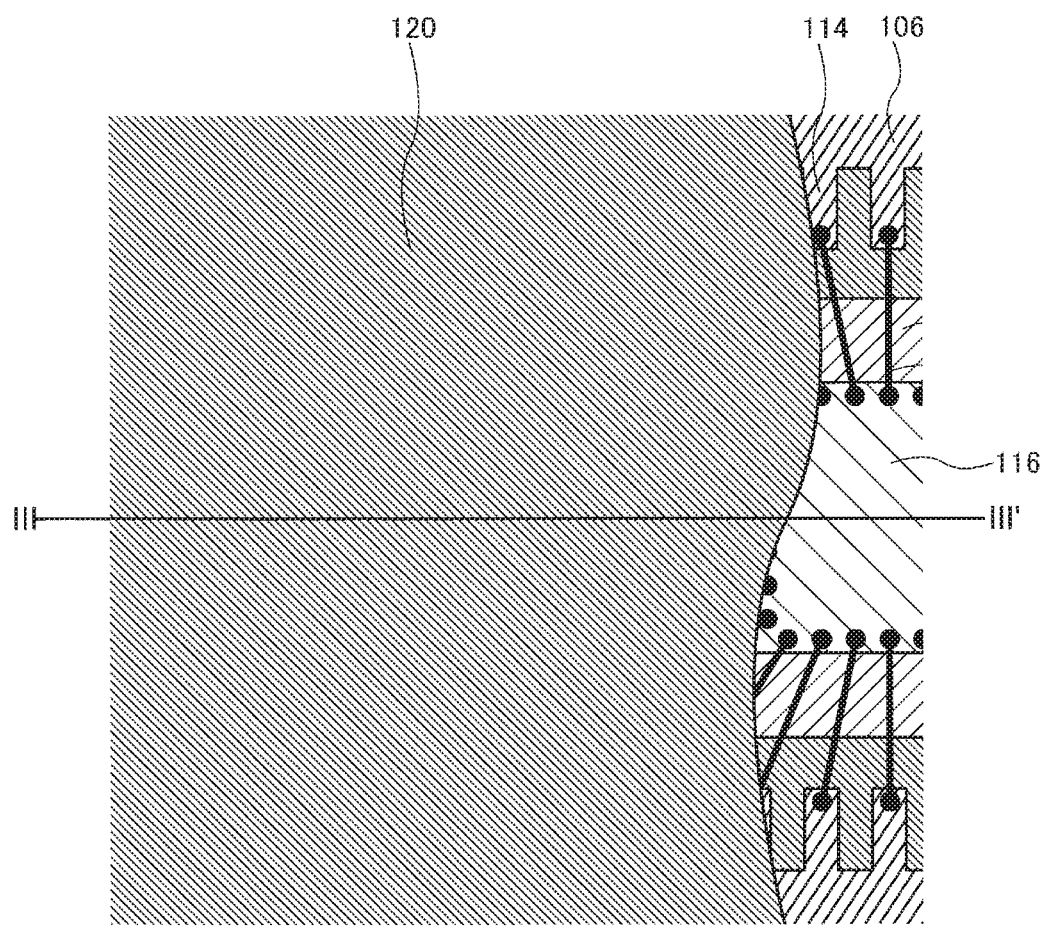
FIG. 12E is a plan view showing a step of the method for manufacturing the semiconductor package in the embodiment according to the present invention.
Figure 12F:
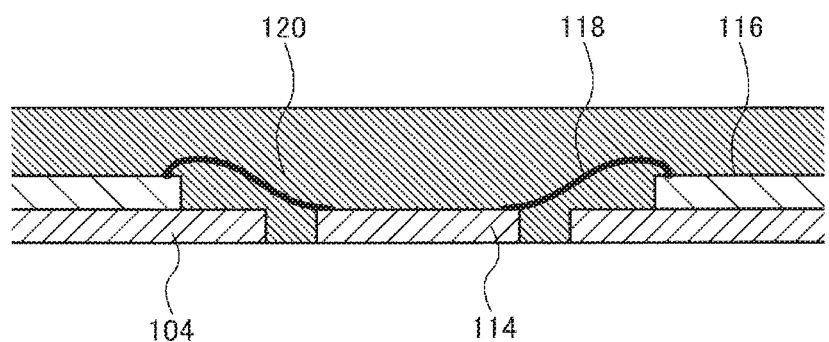
FIG. 12F is a cross-sectional view showing the step of the method for manufacturing the semiconductor package in the embodiment according to the present invention.

Next, the sealing member 120 covering the die pad 104, the plurality of external connection terminals 114 and the semiconductor chip 116 is formed (FIG. 12E and FIG. 12F). The sealing member 120 exposes the bottom surfaces 114b of the plurality of external connection terminals 114. The sealing member 120 is formed by a mold process.

Figure 12G:
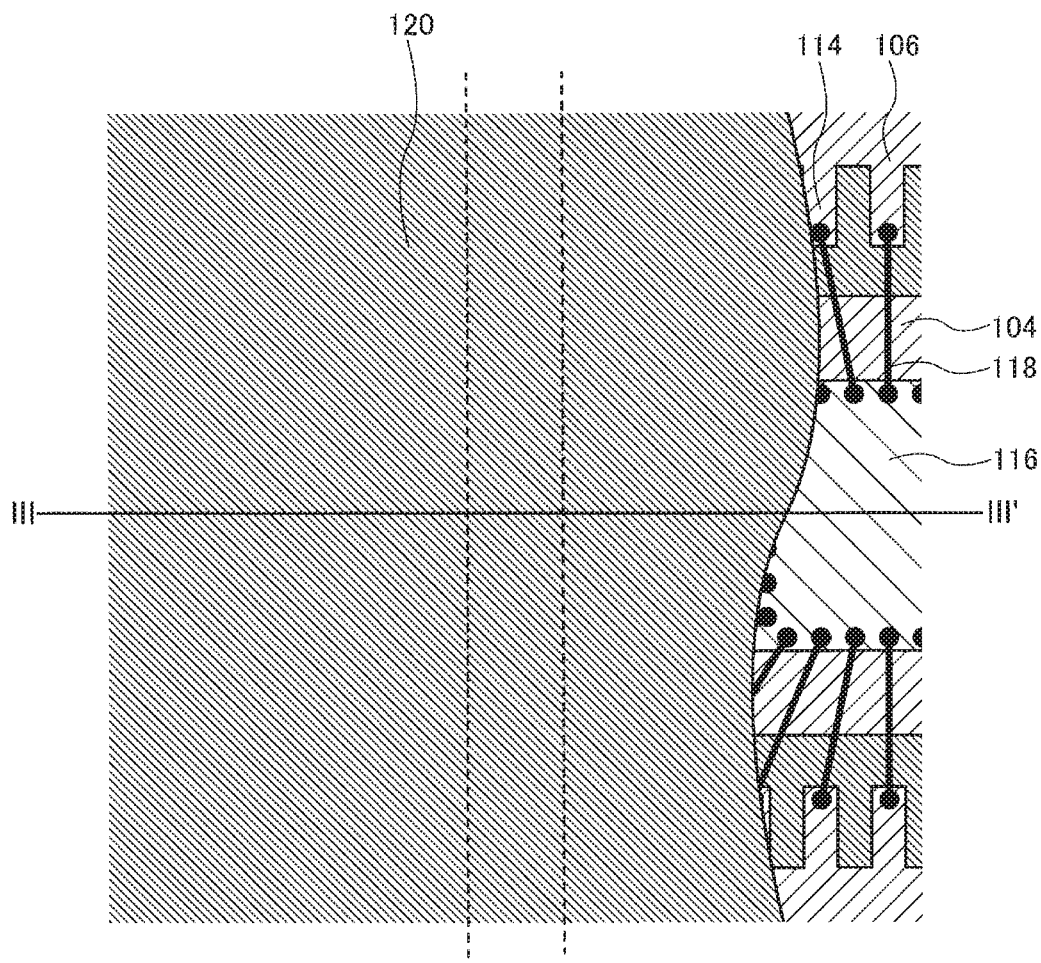
FIG. 12G is a plan view showing a step of the method for manufacturing the semiconductor package in the embodiment according to the present invention.
Figure 12H:
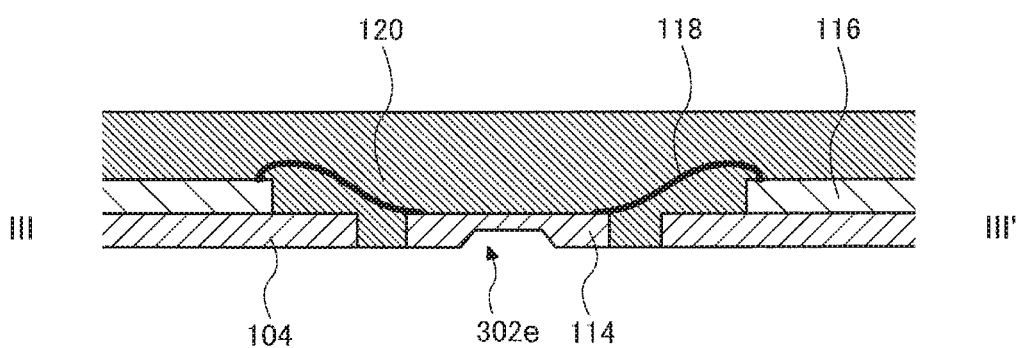
FIG. 12H is a cross-sectional view showing the step of the method for manufacturing the semiconductor package in the embodiment according to the present invention.

Next, the outer terminals 114e of the plurality of external connection terminals 114 are at least partially thinned from the bottom surfaces 114b by a cutting process (FIG. 12G and FIG. 12H).

In this embodiment, the outer terminals 114e are partially thinned from the bottom surface 114b by forming a groove 302e including the dicing line 302d. The groove 302e has an inclining side surface. The inclining side surface allows an opening edge of the groove 302e to be located outer to a bottom surface of the groove 302e as seen in a bottom view.

Figure 12I:
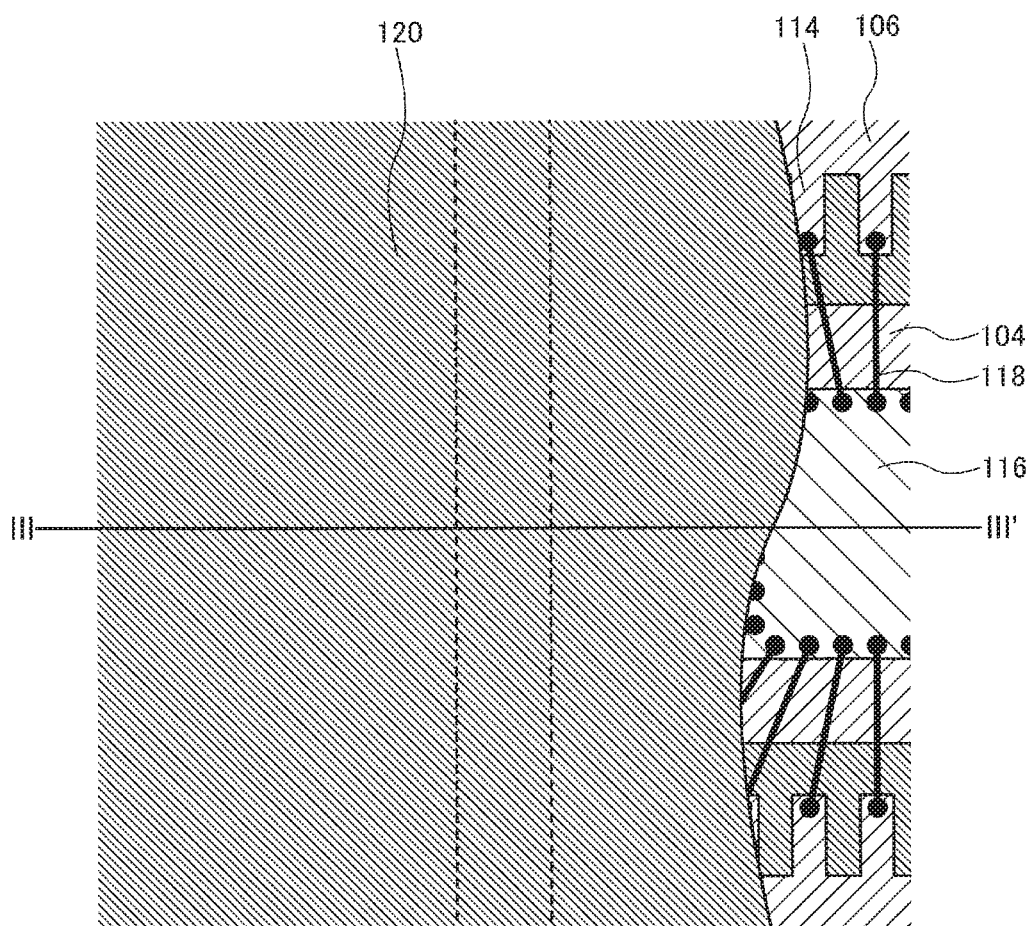
FIG. 12I is a plan view showing a step of the method for manufacturing the semiconductor package in the embodiment according to the present invention.
Figure 12J:
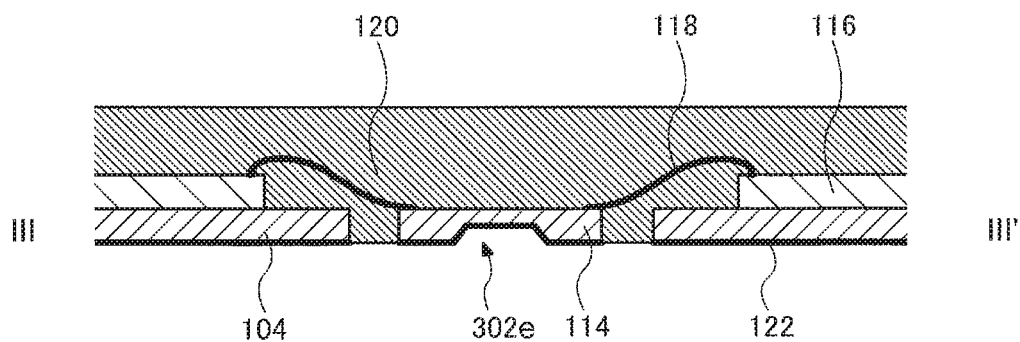
FIG. 12J is a cross-sectional view showing the step of the method for manufacturing the semiconductor package in the embodiment according to the present invention.

Next, an electrolytic plating process is performed to supply an electric current to the lead frame 302. As a result, the plating layer 122 is formed on the exposed area of the lead frame 102 (FIG. 12I and FIG. 12J).

Next, the plurality of semiconductor packages 300 are separated from each other by a cutting process. As a result of the above-described steps, the semiconductor package 300 in this embodiment shown in FIG. 10A through FIG. 11B is provided.

The dicing line 302d is located in the bottom surface of the groove 302e. Therefore, the inclining side surface of the groove 302e remains without being cut off. As a result, the external connecting terminals 114 are each formed such that the outer terminal 114e includes the tapering portion 114i.

So far, the method for manufacturing the semiconductor package 300 in this embodiment has been described. The method for manufacturing the semiconductor package 300 in this embodiment allows the plating layer 122 to be provided on the exposed side surface 114c of the outer terminal 114e of each external connection terminal 114. Therefore, the semiconductor package 300 has improved solder wettability at the side surface 114c of the outer terminal 114e of each of the plurality of external connection terminals 114.

The semiconductor package and the method for manufacturing the semiconductor package in each of preferable embodiments according to the present invention have been described above. These embodiments are merely examples, and the present invention is not limited to any of the above-described embodiments. A person of ordinary skill in the art would modify the present invention in various manners without departing from the gist of the present invention provided in the claims. Such modifications should naturally be construed as being encompassed in the technological scope of the present invention.

What is claimed is:

1. A semiconductor package, comprising:
external connection terminals;
a semiconductor device electrically coupled to the external connection terminals;
a sealing member covering the external connection terminals and the semiconductor device, and exposing outer terminal portions of each of the external connection terminals,
wherein the outer terminal portions each include a top surface, a bottom surface, and
an outer end surface extending between the top surface and the bottom surface; and
a plating layer on the top surface and the bottom surface of each of the outer terminal portions,
wherein the plating layer covers at least a portion of the outer end surface.

2. The semiconductor package of claim 1, wherein:
the outer terminal portions are substantially coplanar with an edge of the sealing member.

3. The semiconductor package of claim 1, wherein:
the plating layer fully covers the outer end surface.

4. The semiconductor package of claim 1, further comprising:
a die pad, wherein:
the external connection terminals are located around the die pad;
a lower surface of the die pad is exposed outside of the sealing member; and
the plating layer covers the lower surface of the die pad.

5. The semiconductor package of claim 1, wherein:
the top surface and the bottom surface are on generally flat planes substantially parallel to each other.

6. The semiconductor package of claim 1, wherein:
the top surface of at least one outer terminal portion is interposed between portions of the sealing member, and
the top surface of the least one outer terminal portion and the portions of the sealing member are substantially coplanar.

7. A semiconductor package comprising:
a lead frame comprising a first external connection terminal;
a semiconductor device electrically coupled to the first external connection terminal with a first interconnect;
a sealing member covering the first external connection terminal and the semiconductor device;
a plating layer; and
a groove disposed in a bottom surface of the sealing member adjoining an inner terminal portion of the first external connection terminal;
wherein:
the first external connection terminal comprises:
a bottom end exposed from the sealing member; and
an outer terminal portion having a side end exposed from the sealing member;
the plating layer covers at least a top portion of the side end; and
the first interconnect is the only internal attachment to the first external connection terminal.

8. The semiconductor package of claim 7, wherein:
the plating layer fully covers the side end.

9. The semiconductor package of claim 7, wherein:
the outer terminal portion is substantially coplanar with an edge of the sealing member.

10. The semiconductor package of claim 7 further comprising:
a die pad;
wherein the semiconductor device is attached to a top surface of the die pad, and the plating layer is further disposed on a bottom surface of the die pad.

11. The semiconductor package of claim 7, wherein:
the side end of the outer terminal portion comprises a tapered portion extending from a part of the side end to a part of a top end of the outer terminal portion;
the plating layer is disposed on the tapered portion of the outer terminal portion; and
the sealing member covers the top end of the outer terminal portion.

12. The semiconductor package of claim 1, wherein:
at a first package side of the semiconductor package:
a first sidewall of the sealing member and the outer end surfaces of the outer terminal portions are along a first plane; and
a second sidewall of the sealing member is along a second plane.

13. The semiconductor package of claim 12, wherein:
at the first package side of the semiconductor package:
  a third sidewall of the sealing member and the top surfaces of the outer terminal portions are along a third plane; and
the third sidewall extends between the first sidewall and the second sidewall.

14. The semiconductor package of claim 1, further comprising:
  a groove disposed in a bottom surface of the sealing member adjoining inner terminal portions of the external connection terminals.

15. The semiconductor package of claim 7, wherein:
at a first package side of the semiconductor package:
  a first sidewall of the sealing member and the side end of the outer terminal portion are along a first plane; and
  a second sidewall of the sealing member is along a second plane.

16. The semiconductor package of claim 15, wherein:
the outer terminal portion includes a top end opposite to the bottom end;
at the first package side of the semiconductor package:
  a third sidewall of the sealing member and the top end of the outer terminal portion are along a third plane;
the third sidewall extends between the first sidewall and the second sidewall; and
the plating layer covers the top end.

* * * * *